(12) United States Patent
Bohmer et al.

(10) Patent No.: US 12,720,927 B2
(45) Date of Patent: Aug. 25, 2026

(54) CRACK SENSITIVITY REDUCTION IN POROUS OPTICAL LAYERS

(71) Applicant: LUMILEDS LLC, San Jose, CA (US)

(72) Inventors: Marcel Rene Bohmer, Eindhoven (NL); Emma Dohner, Redwood City, CA (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 740 days.

(21) Appl. No.: 18/071,079

(22) Filed: Nov. 29, 2022

(65) Prior Publication Data

US 2023/0178692 A1 Jun. 8, 2023

Related U.S. Application Data

(60) Provisional application No. 63/285,775, filed on Dec. 3, 2021.

(51) Int. Cl.

| | |
|---|---|
| ***H10H 20/851*** | (2025.01) |
| ***H10H 20/01*** | (2025.01) |
| ***H10H 20/80*** | (2025.01) |
| ***H10H 20/825*** | (2025.01) |
| ***H10H 20/831*** | (2025.01) |
| ***H10H 20/84*** | (2025.01) |
| ***H10H 29/14*** | (2025.01) |

(52) U.S. Cl.

CPC ...... *H10H 20/8511* (2025.01); *H10H 20/825* (2025.01); *H10H 20/8312* (2025.01); *H10H 20/84* (2025.01); *H10H 29/142* (2025.01); *H10H 20/0361* (2025.01); *H10H 20/882* (2025.01)

(58) Field of Classification Search

CPC ............ H10H 20/8511; H10H 20/825; H10H 20/8312; H10H 20/84; H10H 29/142; H10H 20/0361; H10H 20/882; H10H 20/8514

See application file for complete search history.

(56) References Cited

U.S. PATENT DOCUMENTS

| | | |
|---|---|---|
| 10,797,207 B2 | 10/2020 | Estrada et al. |
| 11,309,355 B2 | 4/2022 | Lin et al. |
| 2006/0049745 A1 | 3/2006 | Handa et al. |

(Continued)

FOREIGN PATENT DOCUMENTS

| | | |
|---|---|---|
| KR | 10-2020-0125897 A | 11/2020 |

OTHER PUBLICATIONS

From KIPO as the ISA, Notification of Transmittal of the International Search Report and the Written Opinion of the International Searching Authority, or the Declaration, PCT/US2022/051194, Apr. 14, 2023, 10 pages.

(Continued)

*Primary Examiner* — Eliseo Ramos Feliciano
*Assistant Examiner* — Sophia W Kao

(57) ABSTRACT

A lighting device is disclosed that includes a plurality of light emitting diodes arranged in an array, trenches disposed between the light emitting diodes, and a scattering layer disposed in the trenches, the scattering layer including a binder matrix, a plurality of scattering particles disposed in the binder matrix, and a plurality of porous particles containing a gas, the porous particles disposed in the binder matrix.

16 Claims, 18 Drawing Sheets

(56) References Cited

U.S. PATENT DOCUMENTS

| | | | | |
|---|---|---|---|---|
| 2013/0257264 | A1* | 10/2013 | Tamaki | F21V 13/08 313/503 |
| 2015/0171372 | A1* | 6/2015 | Iwata | H10H 20/855 257/89 |
| 2016/0109099 | A1* | 4/2016 | Okuno | H10H 20/84 257/40 |
| 2017/0003547 | A1* | 1/2017 | Tochigi | H10K 59/877 |
| 2017/0294563 | A1 | 10/2017 | Hashimoto | |
| 2018/0122993 | A1* | 5/2018 | Camras | C23C 16/45525 |
| 2019/0195466 | A1* | 6/2019 | Shimizu | H10H 20/8514 |
| 2019/0198721 | A1* | 6/2019 | Chamberlin | H10H 20/8511 |
| 2020/0243729 | A1 | 7/2020 | Bohmer et al. | |
| 2021/0126042 | A1 | 4/2021 | Basin et al. | |
| 2021/0184083 | A1 | 6/2021 | Bohmer et al. | |

OTHER PUBLICATIONS

The extended European search report, EP 22902066.4, Jan. 19, 2026, 12 pages.

* cited by examiner

CRACK SENSITIVITY REDUCTION IN POROUS OPTICAL LAYERS

CROSS-REFERENCE TO RELATED APPLICATION

This application claims priority of U.S. Application No. 63/285,775 titled "Crack Sensitivity Reduction in Porous Optical Layers," filed Dec. 3, 2021, and incorporated herein by reference in its entirety.

FIELD OF THE INVENTION

The disclosure relates generally to pcLEDs and pcLED arrays, and more particularly to lighting devices, light sources, and visualization systems having separated phosphor pixels in an array.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Inorganic LEDs and pcLEDs have been widely used to create different types of displays, matrices and light engines including automotive adaptive headlights, augmented-reality (AR) displays, virtual-reality (VR) displays, mixed-reality (MR) displays (AR, VR, and MR systems referred to herein as visualization systems), smart glasses and displays for mobile phones, smart watches, monitors and TVs, and flash illumination for cameras in mobile phones. Individual LEDs or pcLEDs in these architectures can have an area of a few square millimeters down to a few square micrometers (e.g., microLEDs) depending on the matrix or display sized and its pixel per inch requirements.

SUMMARY

In one aspect, a lighting device is disclosed that includes a plurality of light emitting diodes arranged in an array; a plurality of phosphor pixels disposed over the light emitting diodes, and a scattering layer disposed in gaps between phosphor pixels, the scattering layer including a binder matrix, a plurality of scattering particles disposed in the binder matrix, and a plurality of larger particles disposed in the matrix, the larger particles being larger than the scattering particles. The gaps may have a width W and the larger particles have a particle diameter D90 that is less than 0.9 W. The larger particles may have a maximum particle diameter dmax that is less than 0.5 W. The larger particles may have a maximum particle diameter dmax that is between 0.3 W and 0.9 W. The larger particles may have an average diameter D50 that is at least five times larger than the average diameter D50 of the scattering particles. The larger particles may be spherical, or essentially spherical. The larger particles are porous, and include cavities containing a gas. The gas may be air. The larger particles may include silica. The scattering particles may include $TiO_2$. The larger particles that are porous may include cavities having an average size of between 100 nm and 300 nm. The binder matrix may include a sol-gel material. The binder matrix may include openings disposed in the binder matrix, the openings containing a gas. The binder matrix may include silicone. The scattering particles may be between 20 to 50 volume percent of the scattering layer, the larger particles between 20 to 50 volume percent of the scattering layer, and the binder matrix between 10 and 30 volume percent of the scattering layer.

In another aspect, a scattering layer for an optical device is disclosed, the scattering layer including a binder matrix, a plurality of scattering particles disposed in the binder matrix; and a plurality of porous particles containing a gas, the porous particles disposed in the binder matrix. The porous particles may include silica. An average diameter D50 of the porous particles may be at least 5 time greater than an average diameter D50 of the scattering particles. The binder matrix may include a sol-gel material and openings containing a gas.

In yet another aspect, a method of forming a scattering layer for a light emitting device is disclosed, the lighting device including a plurality of light emitting diode structures separated by trenches, the method including forming a plurality of phosphor pixels on a substrate; depositing a layer of a mixture into gaps between the phosphor pixels, the mixture comprising scattering particles, porous particles containing a gas, a binder matrix precursor material, and a solvent; and curing the layer to remove the solvent and convert the binder matrix precursor material into a binder matrix, the scattering particles and porous particles being disposed within the binder matrix to form the scattering layer in the gaps. The binder matrix precursor material may include sol-gel precursor compounds and the binder matrix may include hydrolyzed sol-gel and openings. The sol-gel precursor compounds may include a combination of methyl-tri-ethoxy silane and dimethyl-diethoxy silane and the solvent may include an alcohol. The trenches have a width W and the porous particles may have a D90 particle diameter that is less than 0.9 W. The substrate may be a carrier substrate, the method further including removing the substrate from the plurality of phosphor pixels and cured binder matrix from the carrier substrate.

These and other embodiments, features and advantages will become more apparent to those skilled in the art when taken with reference to the following more detailed description in conjunction with the accompanying drawings that are first briefly described.

DETAILED DESCRIPTION

Figure 1:
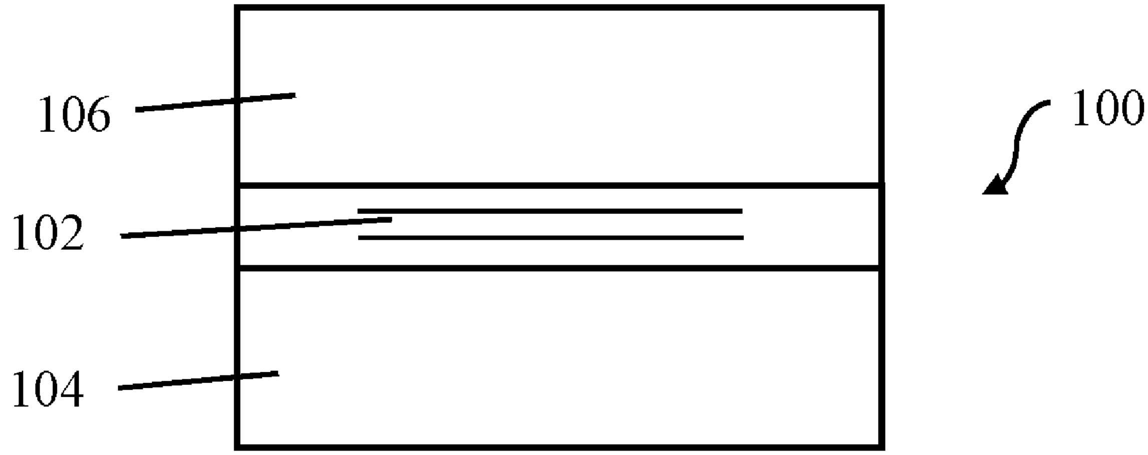
FIG. 1 shows a schematic cross-sectional view of an example pcLED.

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

As used herein, spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below, depending on the orientation of the device. The device may be otherwise oriented (rotated 90 degrees or at other orientations) and the spatially relative descriptors used herein interpreted accordingly.

Light emitting pixel arrays are light emitting devices in which a large number of small light emitting devices, such as, for example pcLEDs, are arrayed on a substrate, which may be a semiconductor die or chip. The individual pcLEDs, or pixels, in a light emitting pixel array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated electronics and optics may be distinct at a pixel, pixel block, or device level.

Light emitting pixel arrays have a wide range of applications. Light emitting pixel array luminaires can include light fixtures which can be programmed to project different lighting patterns based on selective pixel activation and intensity control. Such luminaires can deliver multiple controllable beam patterns from a single lighting device using no moving parts. Typically, this is done by adjusting the brightness of individual LEDs in a 1D or 2D array. Optics, whether shared or individual, can optionally direct the light onto specific target areas Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided. Light emitting arrays used for display may also be useful for augmented-reality (AR) displays, virtual-reality (VR) displays, mixed-reality (MR) displays (AR, VR, and MR systems referred to herein as visualization systems).

Vehicle headlamps are a light emitting array application that requires large pixel numbers and a high data refresh rate. Automotive headlights that actively illuminate only selected sections of a roadway can be used to reduce problems associated with glare or dazzling of oncoming drivers. Using infrared cameras as sensors, light emitting pixel arrays activate only those pixels needed to illuminate the roadway, while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

FIG. 1 shows an example of an individual pcLED 100 comprising a light emitting semiconductor diode structure 102 disposed on a substrate 104, together considered herein an "LED", and a converter layer 106 disposed on the LED. Light emitting semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

The converter layer 106 includes a converter material, such as a phosphor, an organic dye, or a quantum dot, that downconverts light emitted by the LED. Choice of converter material depends on the desired optical output from the pcLED.

Figure 2A:
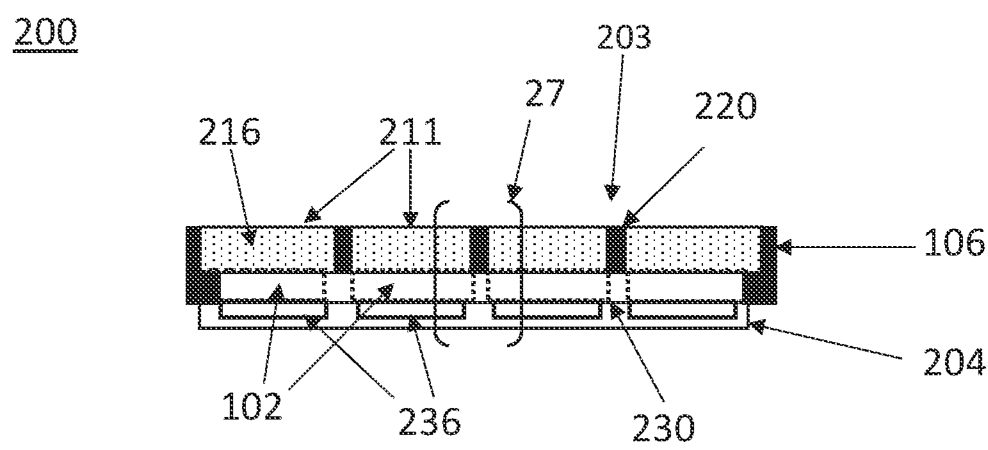
FIGS. 2A and 2B show cross-sectional views of arrays of pcLEDs.
Figure 2B:
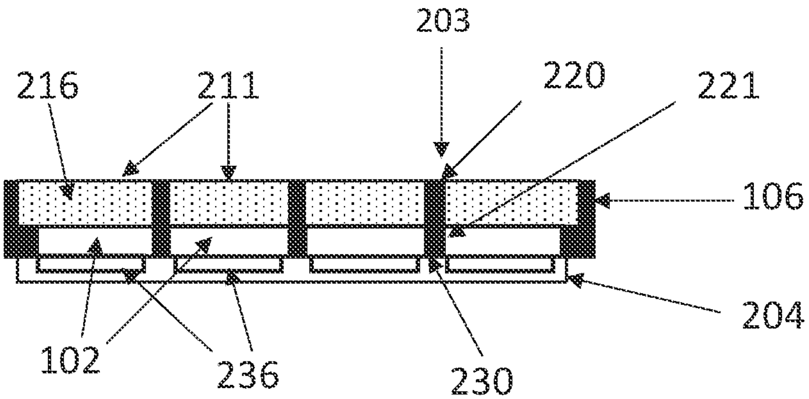
Figure 2C:
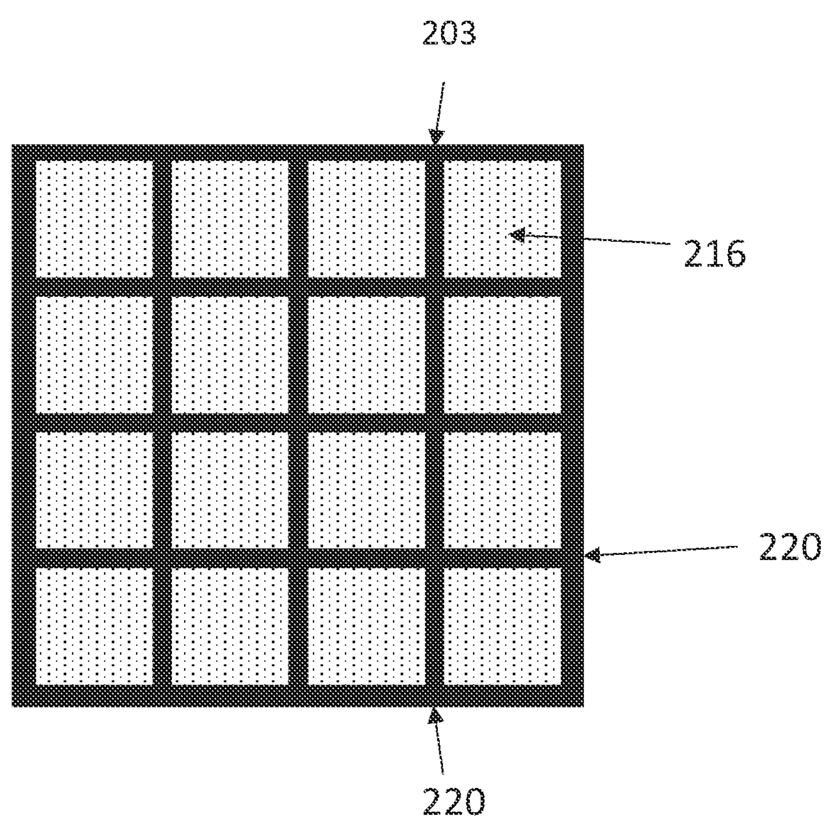
FIG. 2C shows a top schematic view of an array of pc LEDs.
Figure 2D:
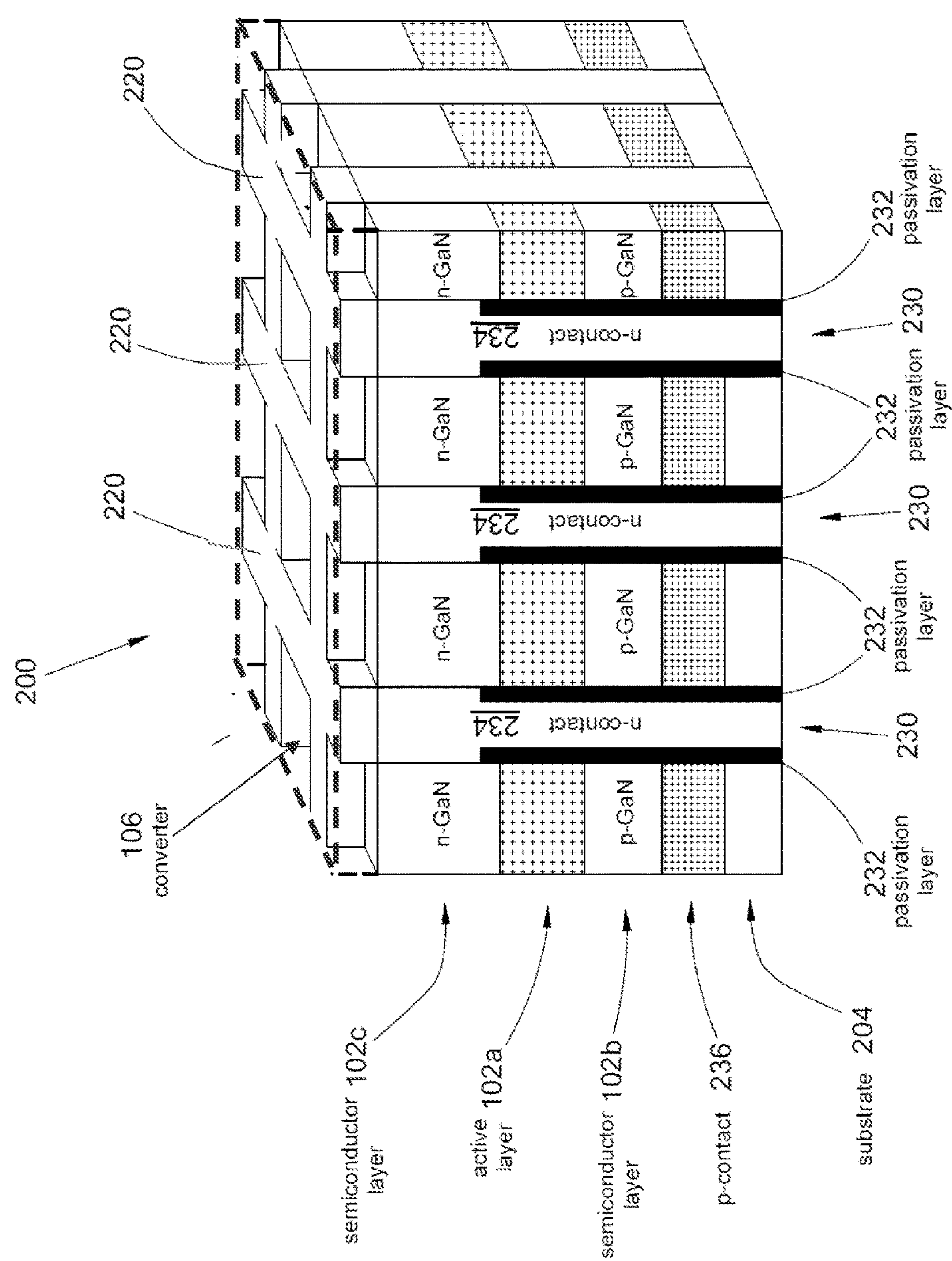
FIG. 2D shows a perspective view of several LEDs of an example pcLED array monolithically formed on a substrate.

FIGS. 2A and 2B illustrate a cross-sectional view of a matrix, or an array, of pcLEDs. FIG. 2C illustrates a top view of a matrix, or an array, of pcLEDs.

Array 200 of FIGS. 2A, 2B and 2C includes converter layer 106, which is formed of a plurality of converter layer pixels 216 each disposed on one of a plurality of light emitting diode structures 102. Converter layer pixels 216 may be referred to herein as "phosphor pixels," which are the portion of the converter layer 106 including phosphor material that is disposed over the light emitting element or elements, e.g., LED 102. Together, each phosphor pixel 216 and corresponding LED 102 forms a lighting pixel 211, and array 200 includes a plurality of lighting pixels 211. Phosphor pixels 216 are separated by a grid of optical isolation barriers 220, which are formed within the gaps 203 between phosphor pixels 216. Note that while array 200 shows each phosphor pixel 216 disposed over a single corresponding LED 102, in some cases, phosphor pixels may be disposed over multiple LEDs, or multiple phosphor pixels may be disposed over a single LED, in each case, the phosphor pixels defined by the grid of optical isolation barriers 220. In FIG. 2A, the light emitting diode structures 102 are formed in a monolithic layer, and the optical isolation barriers 220 are formed in gaps 203 between the phosphor pixels 216. In another embodiment, shown in FIG. 2B, the light emitting diode structure 102 are formed individually, and the optical isolation barriers 220 extend between both the converter layer pixels 216 and also into area 221 between the corresponding light emitting diode structures 102.

The optical isolation barriers 220, which may be a scattering layer, as described in more detail below, separate each of the lighting pixels 211, and may be separately formed on and over trenches 230 (FIG. 2A) or on and within trenches 230 (FIG. 2B). Such optical isolation barriers 220 can allow for the lighting pixels 211 to have high contrast between neighboring pixels.

Array 200 also includes contacts 236 for electrically connecting each light emitting diode structure 102. Contacts 236 and light emitting diode structures 102 may be situated on a substrate 204. An example of a light emitting diode 102 and contact 236 structure on a substrate 204 will be described in more detail with respect to FIG. 2C.

As shown in FIG. 2C, an array of LEDs, or portions of such an array, may be formed as a segmented monolithic structure (such as that shown in FIG. 2A) in which individual LED pixels are electrically isolated from each other by trenches and/or insulating material, but the electrically isolated segments remain physically connected to each other by portions of the semiconductor structure. FIG. 2C shows a perspective view of an example of such a segmented monolithic LED structure, which may be used to form an array such as array 200. Individual semiconductor LED devices 102 in array 200 are separated by trenches 230 which are filled to form n contacts 234. The monolithic structure is grown or disposed on the substrate 204. Each pixel includes a p contact 236, a p GaN semiconductor layer 102*b*, an active region 102*a*, and an n GaN semiconductor layer 102*c*; the layers 102*a*/102*b*/102*c* collectively form the semiconductor LED 102. A converter layer 106 may be deposited on the semiconductor layer 102*c* (or other applicable intervening layer). Passivation layers 232 may be formed within the trenches 230 to separate at least a portion of the n contacts 234 from one or more layers of the semiconductor. The n contacts 234, other material within the trenches 230, or material different from material within the trenches 230 may extend into the converter layer 106 to form complete or partial optical isolation barriers 220 between the pixels, as described above.

Array 200 may include any suitable number of pcLEDs arranged in any suitable manner. In the illustrated example the array is depicted as formed monolithically on a shared substrate, but alternatively an array of pcLEDs may be formed from separate individual pcLEDs. Substrate 204 may optionally comprise CMOS circuitry for driving the LED, and may be formed from any suitable materials.

Although FIGS. 2A and 2B, show a four by four array of sixteen pcLEDs, such arrays may include for example tens, hundreds, or thousands of LEDs. Individual LEDs may have widths (e.g., side lengths) in the plane of the array, for example, less than or equal to 1 millimeter (mm), less than or equal to 500 microns, less than or equal to 100 microns, or less than or equal to 50 microns. LEDs in such an array may be spaced apart from each other by trenches, sometimes referred to as streets or lanes, 230 having a width in the plane of the array of, for example, hundreds of microns, less than or equal to 100 microns, less than or equal to 50 microns, less than or equal to 10 microns, or less than or equal to 5 microns, for example, 15-20 microns. Although the illustrated examples show rectangular pixels arranged in a symmetric matrix, the pixels and the array may have any suitable shape or arrangement, and need not all be of the same shape or size. For example, LEDs or pcLEDs located in central portions of an array may be larger than those located in peripheral portions of the array. Alternatively, LEDs or pcLEDs located in central portions of an array may be smaller than those located in peripheral portions of the array.

LEDs having dimensions in the plane of the array (e.g., side lengths) of less than or equal to about 50 microns are typically referred to as microLEDs, and an array of such microLEDs may be referred to as a microLED array.

Figure 3A:
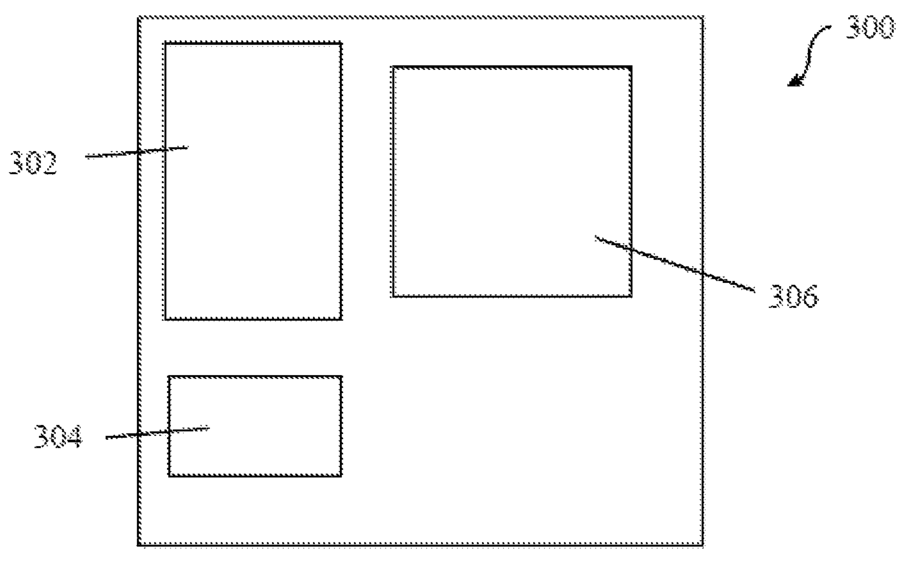
FIG. 3A shows a schematic top view of an electronics board on which an array of pcLEDs may be mounted, and FIG. 3B similarly shows an array of pcLEDs mounted on the electronic board of FIG. 3A.
Figure 3B:
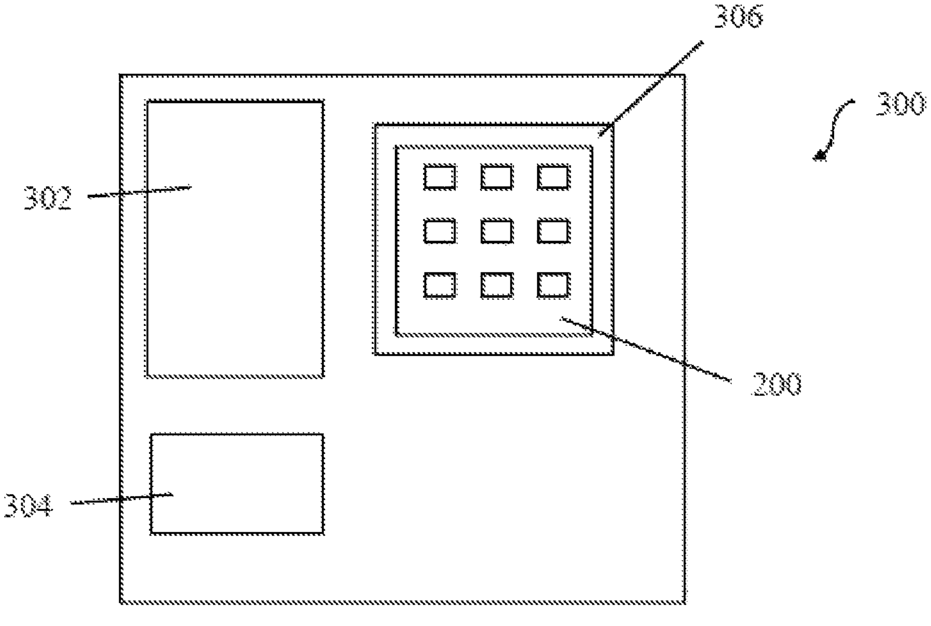

FIGS. 3A and 3B illustrate an example of a device using array 200.

As shown in FIGS. 3A-3B, a pcLED array 200 (FIG. 3B) may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
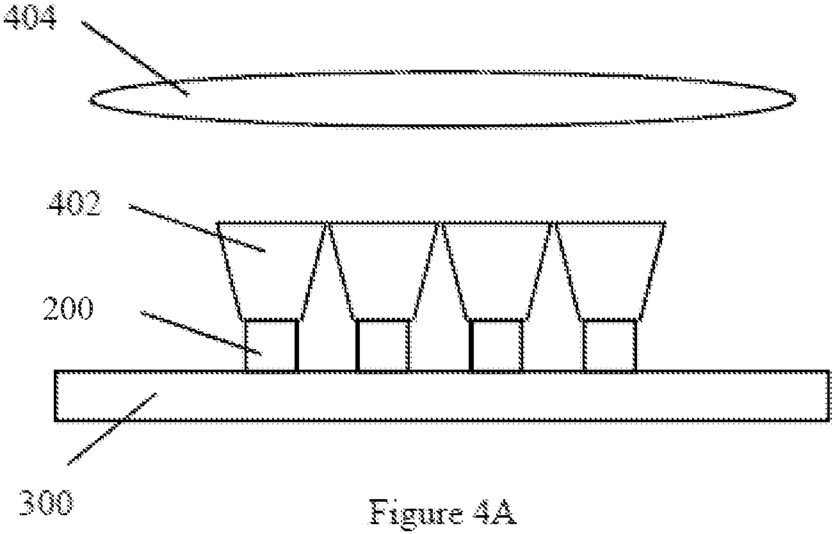
FIG. 4A shows a schematic cross-sectional view of an array of pcLEDs arranged with respect to waveguides and a projection lens.
Figure 4B:
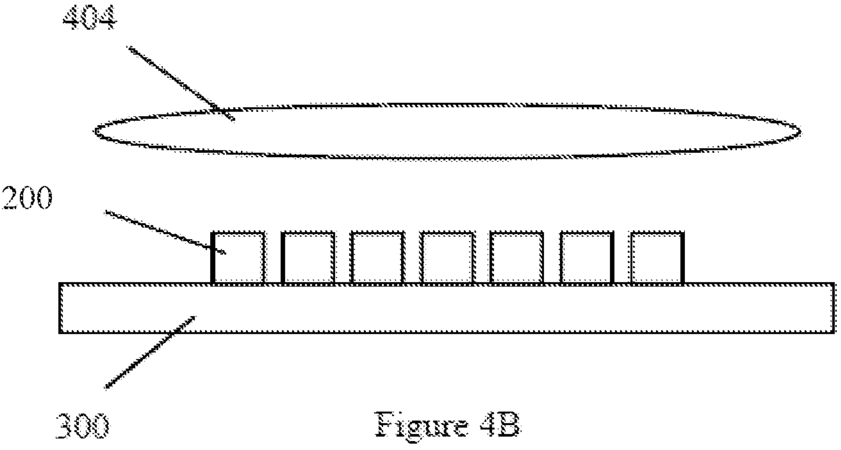
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 200 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 200 is collected directly by projection lens 404 without use of intervening waveguides. This arrangement may be particularly suitable when pcLEDs can be spaced sufficiently close to each other and may also be used in automobile headlights as well as in camera flash applications. A microLED display application may use similar optical arrangements to those depicted in FIGS. 4A-4B, for example. In another example arrangement, a central block of pcLEDs in an array may be associated with a single common (shared) optic, and edge LEDs or pcLEDs located in the array at the periphery of the central bloc are each associated with a corresponding individual optic. Generally, any suitable arrangement of optical elements may be used in combination with the LED arrays described herein, depending on the desired application.

An array of independently operable LEDs may be used in combination with a lens, lens system, or other optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED or pcLED array can be performed electronically by activating LEDs or pcLEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs in an LED array to provide illumination adapted to the scene. Such data can be provided for example by an image sensor, or optical (e.g. laser scanning) or non-optical (e.g. millimeter radar) sensors. Such adaptive illumination is increasingly important for automotive (e.g., adaptive headlights), mobile device camera (e.g., adaptive flash), AR, VR, and MR applications.

Figure 5:
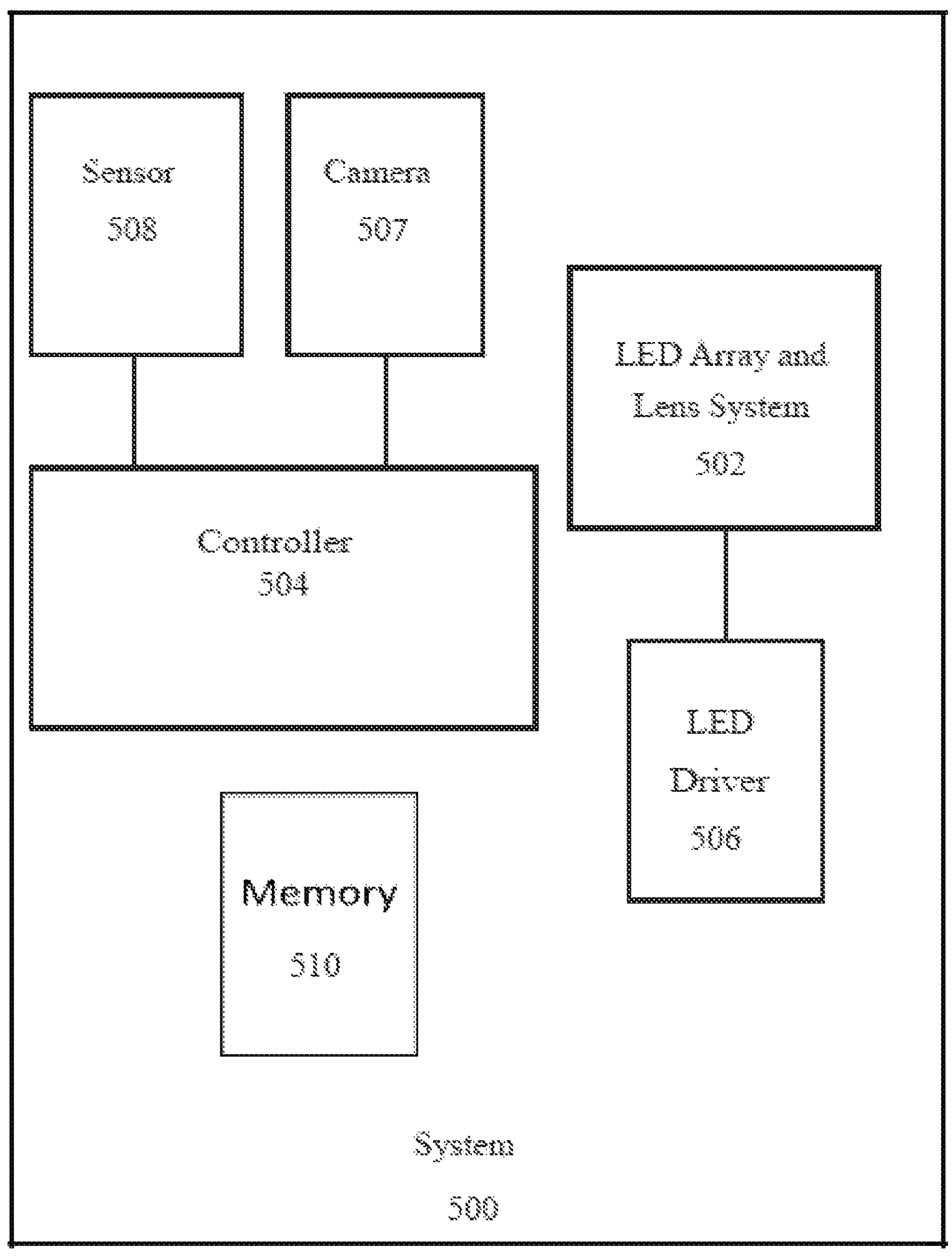
FIG. 5 schematically illustrates an example camera flash system comprising an adaptive illumination system.

FIG. 5 schematically illustrates an example camera flash system 500 comprising a pcLED array and lens system 502, which may be similar or identical to the systems described above in which pcLEDs in the array may be individually operable or operable as groups. In operation of the camera flash system, illumination from some or all of the LEDs or pcLEDs in array and optical system 502 may be adjusted—deactivated, operated at full intensity, or operated at an intermediate intensity. The array may be a monolithic array, or comprise one or more monolithic arrays, as described above. The array may be a microLED array, as described above.

Flash system 500 also comprises an LED driver 506 that is controlled by a controller 504, such as a microprocessor. Controller 504 may also be coupled to a camera 507 and to sensors 508, and operate in accordance with instructions and profiles stored in memory 510. Camera 507 and adaptive illumination system 502 may be controlled by controller 504 to match their fields of view.

Sensors 508 may include, for example, positional sensors (e.g., a gyroscope and/or accelerometer) and/or other sensors that may be used to determine the position, speed, and orientation of system 500. The signals from the sensors 508 may be supplied to the controller 504 to be used to determine the appropriate course of action of the controller 504 (e.g., which LEDs are currently illuminating a target and which LEDs will be illuminating the target a predetermined amount of time later).

In operation, illumination from some or all pixels of the LED array in 502 may be adjusted—deactivated, operated at full intensity, or operated at an intermediate intensity. Beam focus or steering of light emitted by the LED array in 502 can be performed electronically by activating one or more subsets of the pixels, to permit dynamic adjustment of the beam shape without moving optics or changing the focus of the lens in the lighting apparatus.

Figure 6A:
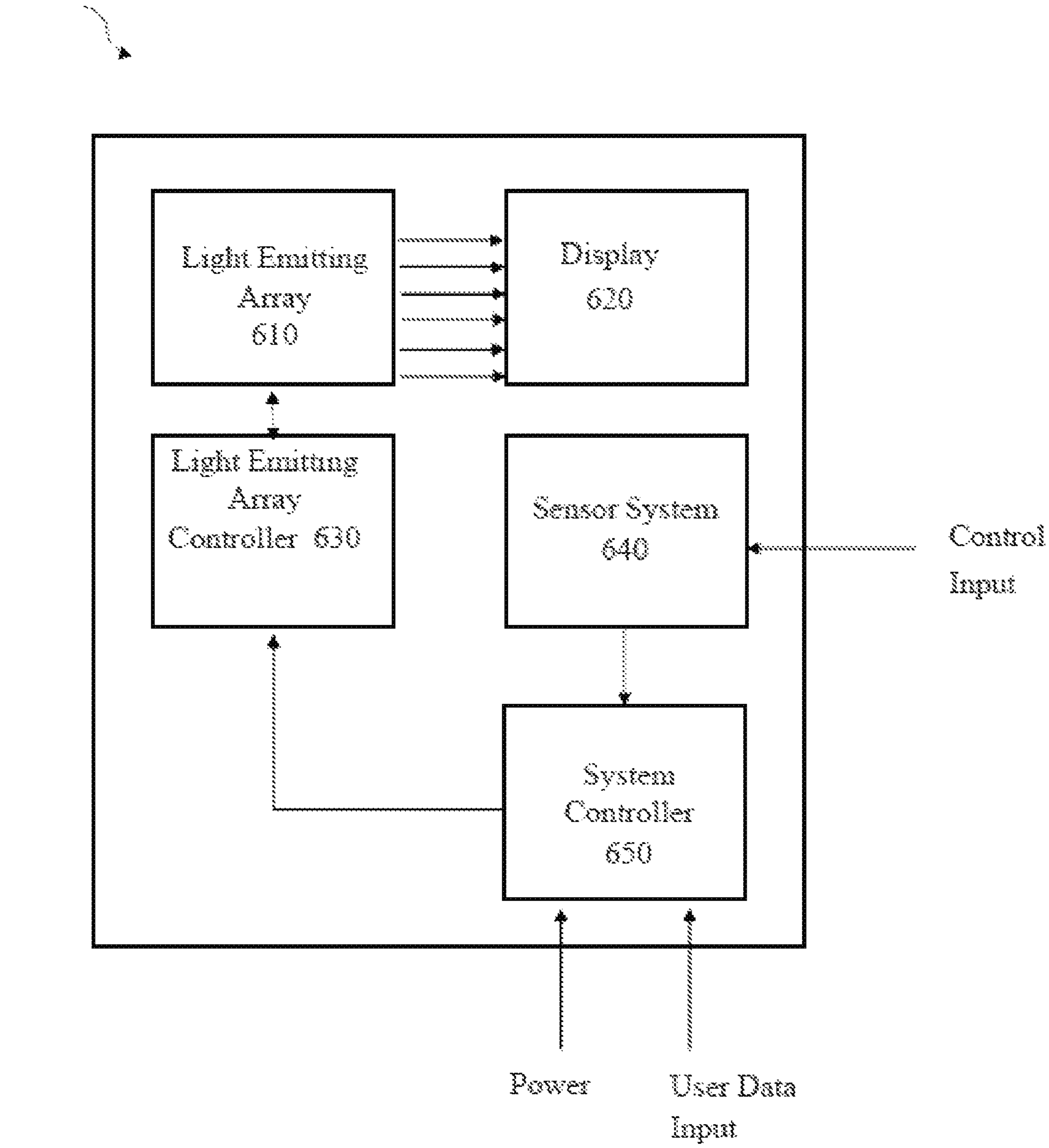
FIG. 6A schematically illustrates an example display (e.g., AR/VR/MR) system that includes an adaptive illumination system

FIG. 6A schematically illustrates an example display (e.g., AR/VR/MR) system 600 that includes an adaptive light emitting array 610, display 620, a light emitting array controller 630, sensor system 640, and system controller 650. Control input is provided to the sensor system 640, while power and user data input is provided to the system controller 650. In some embodiments modules included in system 600 can be compactly arranged in a single structure, or one or more elements can be separately mounted and connected via wireless or wired communication. For example, the light emitting array 610, display 620, and sensor system 640 can be mounted on a headset or glasses, with the light emitting controller and/or system controller 650 separately mounted.

The light emitting array 610 may include one or more adaptive light emitting arrays, as described above, for example, that can be used to project light in graphical or object patterns that can support AR/VR/MR systems. In some embodiments, arrays of microLEDs can be used.

System 600 can incorporate a wide range of optics in adaptive light emitting array 610 and/or display 620, for example to couple light emitted by adaptive light emitting array 610 into display 620.

Sensor system 640 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position.

In response to data from sensor system 640, system controller 650 can send images or instructions to the light emitting array controller 630. Changes or modification to the images or instructions can also be made by user data input, or automated data input as needed. User data input can include but is not limited to that provided by audio instructions, haptic feedback, eye or pupil positioning, or connected keyboard, mouse, or game controller.

As noted above, AR, VR, and MR systems may be more generally referred to as examples of visualization systems. In a virtual reality system, a display can present to a user a view of a scene, such as a three-dimensional scene. The user can move within the scene, such as by repositioning the user's head or by walking. The virtual reality system can detect the user's movement and alter the view of the scene to account for the movement. For example, as a user rotates the user's head, the system can present views of the scene that vary in view directions to match the user's gaze. In this manner, the virtual reality system can simulate a user's presence in the three-dimensional scene. Further, a virtual reality system can receive tactile sensory input, such as from wearable position sensors, and can optionally provide tactile feedback to the user.

In an augmented reality system, the display can incorporate elements from the user's surroundings into the view of the scene. For example, the augmented reality system can add textual captions and/or visual elements to a view of the user's surroundings. For example, a retailer can use an augmented reality system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the augmented reality system can position a virtual chair in a room. The user can stand in the room on a front side of the virtual chair location to view the front side of the chair. The user can move in the room to an area behind the virtual chair location to view a back side of the chair. In this manner, the augmented reality system can add elements to a dynamic view of the user's surroundings.

Figure 6B:
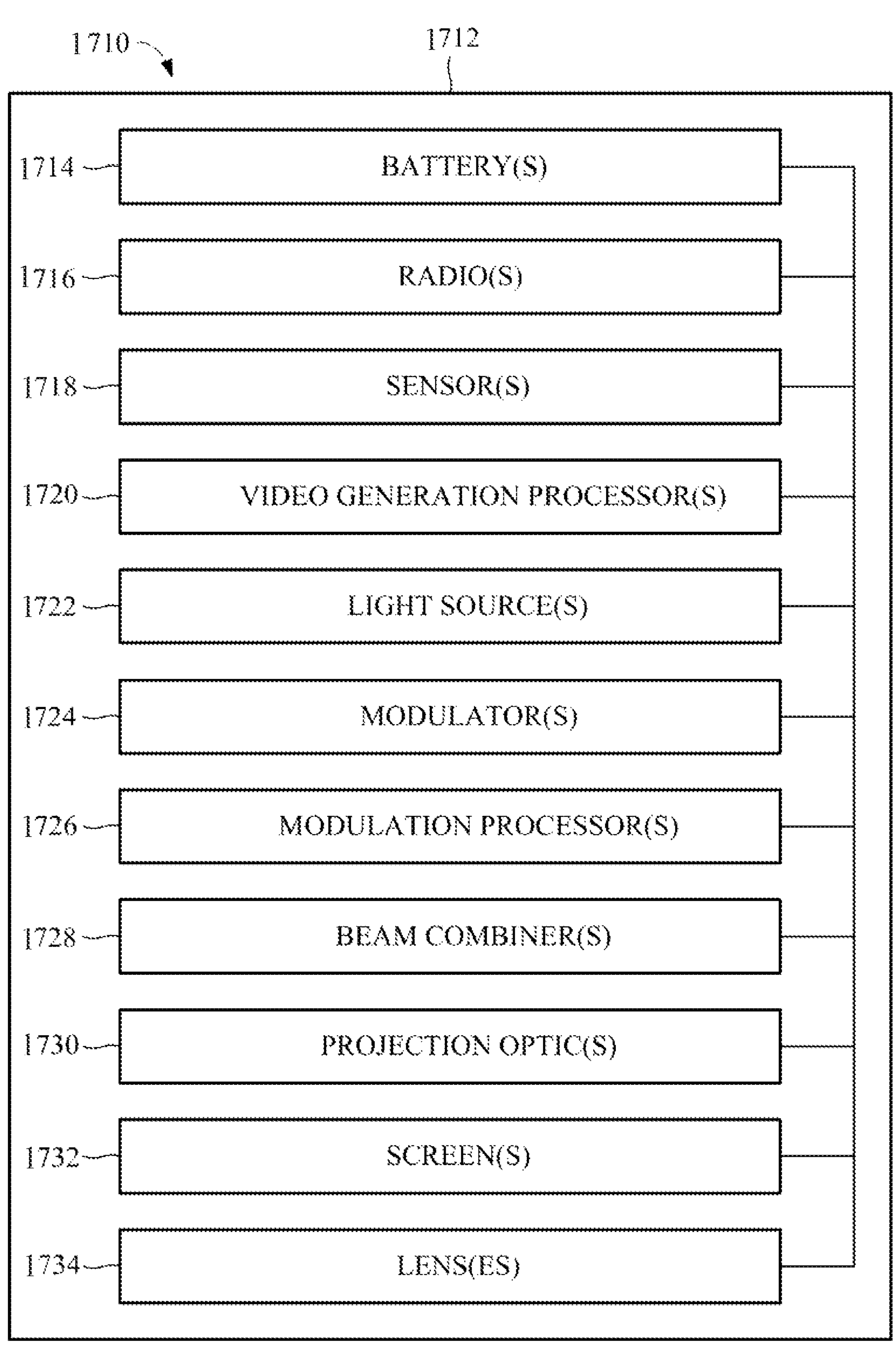
FIG. 6B shows a block diagram of an example visualization system.

FIG. 6B shows a generalized block diagram of an example visualization system 1710. The visualization system 1710 can include a wearable housing 1712, such as a headset or goggles. The housing 1712 can mechanically support and house the elements detailed below. In some examples, one or more of the elements detailed below can be included in one or more additional housings that can be separate from the wearable housing 1712 and couplable to the wearable housing 1712 wirelessly and/or via a wired connection. For example, a separate housing can reduce the weight of wearable goggles, such as by including batteries, radios, and other elements. The housing 1712 can include one or more batteries 1714, which can electrically power any or all of the elements detailed below. The housing 1712 can include circuitry that can electrically couple to an external power supply, such as a wall outlet, to recharge the batteries 1714. The housing 1712 can include one or more radios 1716 to communicate wirelessly with a server or network via a suitable protocol, such as WiFi.

The visualization system 1710 can include one or more sensors 1718, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 1718 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 1718 can capture a real-time video image of the surroundings proximate a user.

The visualization system 1710 can include one or more video generation processors 1720. The one or more video generation processors 1720 can receive, from a server and/or a storage medium, scene data that represents a three-dimensional scene, such as a set of position coordinates for objects in the scene or a depth map of the scene. The one or more video generation processors 1720 can receive one or more sensor signals from the one or more sensors 1718. In response to the scene data, which represents the surroundings, and at least one sensor signal, which represents the location and/or orientation of the user with respect to the surroundings, the one or more video generation processors 1720 can generate at least one video signal that corresponds to a view of the scene. In some examples, the one or more video generation processors 1720 can generate two video signals, one for each eye of the user, that represent a view of the scene from a point of view of the left eye and the right eye of the user, respectively. In some examples, the one or more video generation processors 1720 can generate more than two video signals and combine the video signals to provide one video signal for both eyes, two video signals for the two eyes, or other combinations.

The visualization system 1710 can include one or more light sources 1722 that can provide light for a display of the visualization system 1710. Suitable light sources 1722 can include any of the LEDs, pcLEDs, LED arrays, and pcLED arrays discussed above, for example those discussed above with respect to display system 600.

The visualization system 1710 can include one or more modulators 1724. The modulators 1724 can be implemented in one of at least two configurations.

In a first configuration, the modulators 1724 can include circuitry that can modulate the light sources 1722 directly. For example, the light sources 1722 can include an array of light-emitting diodes, and the modulators 1724 can directly modulate the electrical power, electrical voltage, and/or electrical current directed to each light-emitting diode in the array to form modulated light. The modulation can be performed in an analog manner and/or a digital manner. In some examples, the light sources 1722 can include an array of red light-emitting diodes, an array of green light-emitting diodes, and an array of blue light-emitting diodes, and the modulators 1724 can directly modulate the red light-emitting diodes, the green light-emitting diodes, and the blue light-emitting diodes to form the modulated light to produce a specified image.

In a second configuration, the modulators 1724 can include a modulation panel, such as a liquid crystal panel. The light sources 1722 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 1724 can include multiple modulation panels that can modulate different colors of light. For example, the modulators 1724 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 1724 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 1710 can include one or more modulation processors 1726, which can receive a video signal, such as from the one or more video generation processors 1720, and, in response, can produce an electrical modulation signal. For configurations in which the modulators 1724 directly modulate the light sources 1722, the electrical modulation signal can drive the light sources 1724. For configurations in which the modulators 1724 include a modulation panel, the electrical modulation signal can drive the modulation panel.

The visualization system 1710 can include one or more beam combiners 1728 (also known as beam splitters 1728), which can combine light beams of different colors to form a single multi-color beam. For configurations in which the light sources 1722 can include multiple light-emitting diodes of different colors, the visualization system 1710 can include one or more wavelength-sensitive (e.g., dichroic) beam splitters 1728 that can combine the light of different colors to form a single multi-color beam.

The visualization system 1710 can direct the modulated light toward the eyes of the viewer in one of at least two configurations. In a first configuration, the visualization system 1710 can function as a projector, and can include suitable projection optics 1730 that can project the modulated light onto one or more screens 1732. The screens 1732 can be located a suitable distance from an eye of the user. The visualization system 1710 can optionally include one or more lenses 1734 that can locate a virtual image of a screen 1732 at a suitable distance from the eye, such as a close-focus distance, such as 500 mm, 750 mm, or another suitable distance. In some examples, the visualization system 1710 can include a single screen 1732, such that the modulated light can be directed toward both eyes of the user. In some examples, the visualization system 1710 can include two screens 1732, such that the modulated light from each screen 1732 can be directed toward a respective eye of the user. In some examples, the visualization system 1710 can include more than two screens 1732. In a second configuration, the visualization system 1710 can direct the modulated light directly into one or both eyes of a viewer. For example, the projection optics 1730 can form an image on a retina of an eye of the user, or an image on each retina of the two eyes of the user.

For some configurations of augmented reality systems, the visualization system 1710 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

As noted above, certain applications of pcLED arrays require light emitted from each pcLED or adjacent groups of pcLEDs in the array to be optically separated. Thus, a high contrast ratio between light emitted from certain pcLEDs or adjacent groups of pcLEDs is desired to reduce cross-talk, or light leakage, for example, to reduces light spill from "ON" state pcLEDs or adjacent groups of pcLEDs to neighboring "OFF" state pcLEDs/adjacent groups of pcLEDs, and confine light emitted.

FIGS. 7A, 7B, 7C, and 7D show cross-sectional views of an expanded region (27 of FIG. 2A) of four different optically scattering layers that may be used to form optical isolation barriers between the phosphor pixels in the converter layer.

Figure 7A:
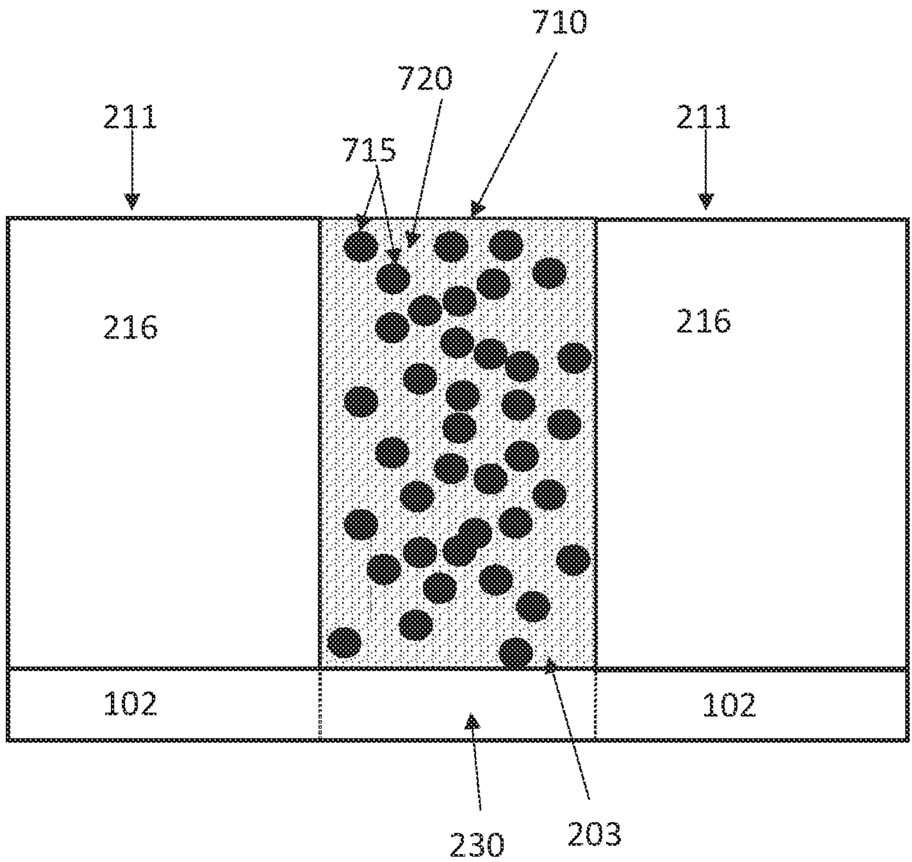
FIGS. 7A, 7B, 7C, and 7D show cross-sectional views of an expanded region of four different optically scattering layers that may be used to form optical isolation barriers between the pcLEDs that form the pixels in an array.

As shown in FIG. 7A, to optically separate pixels in an array, a scattering layer 710 may be formed in a gap 203 disposed over the trench 230 to form an optical isolation barrier between pixels 216 of the converter layer 106. The scattering layer 710 in gap 203 may include small high refractive index particles 715, which may also be referred to herein as scattering particles 715, disposed in a binder matrix 720. For example, scattering layer 710 may include particles 715 with a high refractive index, such as titanium dioxide ($TiO_2$), which form a white scattering layer. These particles 715 may be disposed in a binder matrix material 720, which may be, for example, a silicone. Scattering particles 715 may have an average particle diameter in the range of, for example, 100 nm to 300 nm. Increasing the amount of such scattering particles 715 disposed in the binder matrix 720 up to for instance 50% increases the amount of scattering, and hence improves the optical separation of the pixels 211. However, mixing such high amounts of scatter particles, such as $TiO_2$ particles, into silicone can be difficult to realize. Additionally, as the silicone itself will have a refractive index of around 1.4, the scattering cannot be maximized in such a scattering layer 710.

Figure 7B:
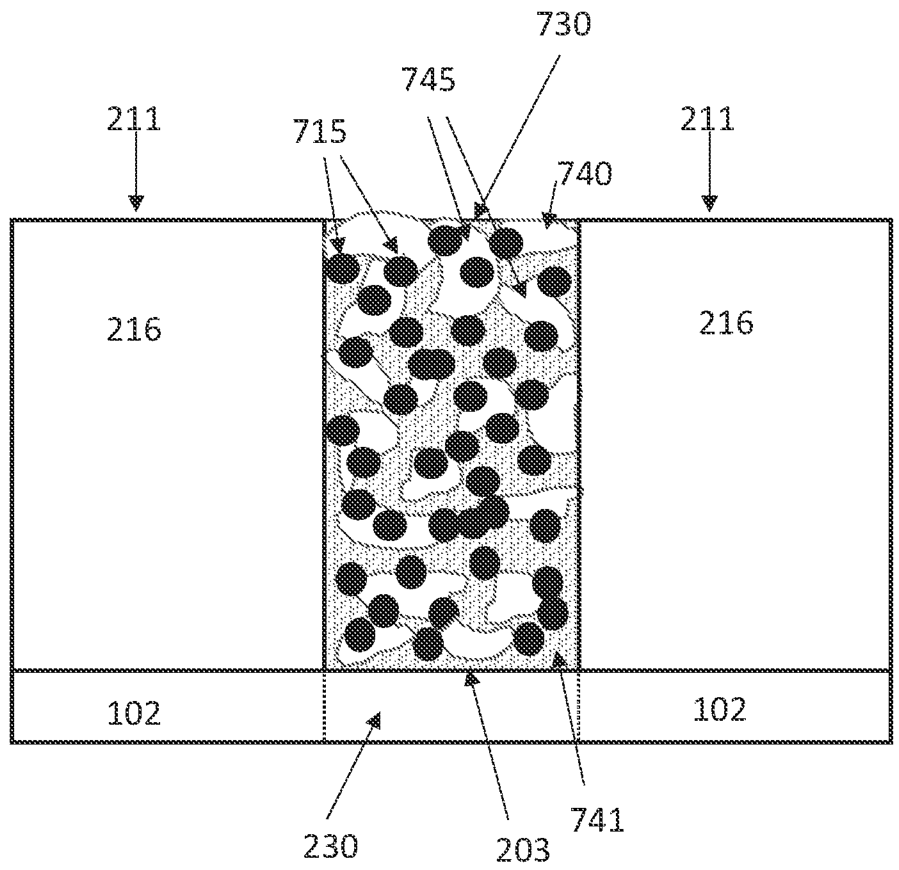

FIG. 7B shows an improved scattering layer 730 that includes a gas, such as air, disposed in openings within the binder matrix. As shown in FIG. 7B, to improve scattering, the binder matrix 740 may be formed in such a way that the binder matrix 740 includes openings 745 in addition to the binder matrix material 741. (Note that while in general the drawings are not to scale, for purposes of illustration, the relative size of the openings 745 as shown FIG. 7B are significantly larger than they would be in the actual device.) Such a binder matrix 740 may be formed using, for example, a sol-gel process. In such a sol-gel process, the precursor materials used to form the binder matrix are added in such an amount that, after curing, what remains is a hydrolyzed sol-gel binder matrix material 741 and openings 745. Openings 745 contain a gas, such as air, and are formed within interstices between the scattering particles 715. The porous scattering layer 730 thus includes scattering particles 715 and a large portion of gas, such as air, disposed in openings 745 within the binder matrix 740. The composition of scattering layer 730 may be, for example, 40-60 volume % scattering particles 715, 5-15 volume % binder matrix material 741, and 35-45 volume % of gas contained in openings 745. For example, the composition may be 50 volume % $TiO_2$ particles, 10 volume % sol-gel binder matrix material, and 40 volume % air. The air in the openings has a refractive index of 1, and due to the high refractive index different between air and $TiO_2$ (a refractive index difference that is greater than the refractive index difference between $TiO_2$ and silicone) more scattering is created. When the porous scattering layer 730 contains a relatively large amount of a gas, such as air, the refractive index differences are maximized, and therefore the scattering is maximized. The maximized scattering improves the optical separation of the converter layer pixels 216.

One of the problems, however, with a porous scattering layer 730 that contain a large amount of gas, such as air, is that the scattering layer can have a high crack sensitivity. That is, during manufacturing and processing, and also during use of, a pcLED array containing a porous scattering layer 730, the scattering layer 730 in the gap 203 is prone to cracking, and may break, split, or even fragment and crumble. Cracking is especially a problem when high expansion coefficients are present in the pcLED array, such as the expansion coefficient of the phosphor-silicone pixels.

To significantly reduce the formation of cracks and crack sensitivity of the scattering layer, particles that are relatively large as compared to the scattering particles can be added into the scattering layer. Such larger particles may have, for example, an average diameter D50 (as defined below with respect to FIG. 8A) that is 3 times larger, in some instances between 3 and 10 times larger, for example, 5 times larger, than the D50 of the high refractive index particles. Such larger particles, however, may reduce the amount of scattering provided by the scattering layer, as they replace for example scattering particles and/or air within the scattering layer.

To further enhance scattering, such particles may be porous, and have cavities that contain gas. The air, or other gas, contained within the porous particles prevent the amount of scattering in such a scattering layer from being significantly decreased as compared to a porous scatter layer 730 formed without the larger particles. Thus, the optical separation of the pixels may remain high while also reducing the crack sensitivity of the layer.

Figure 7C:
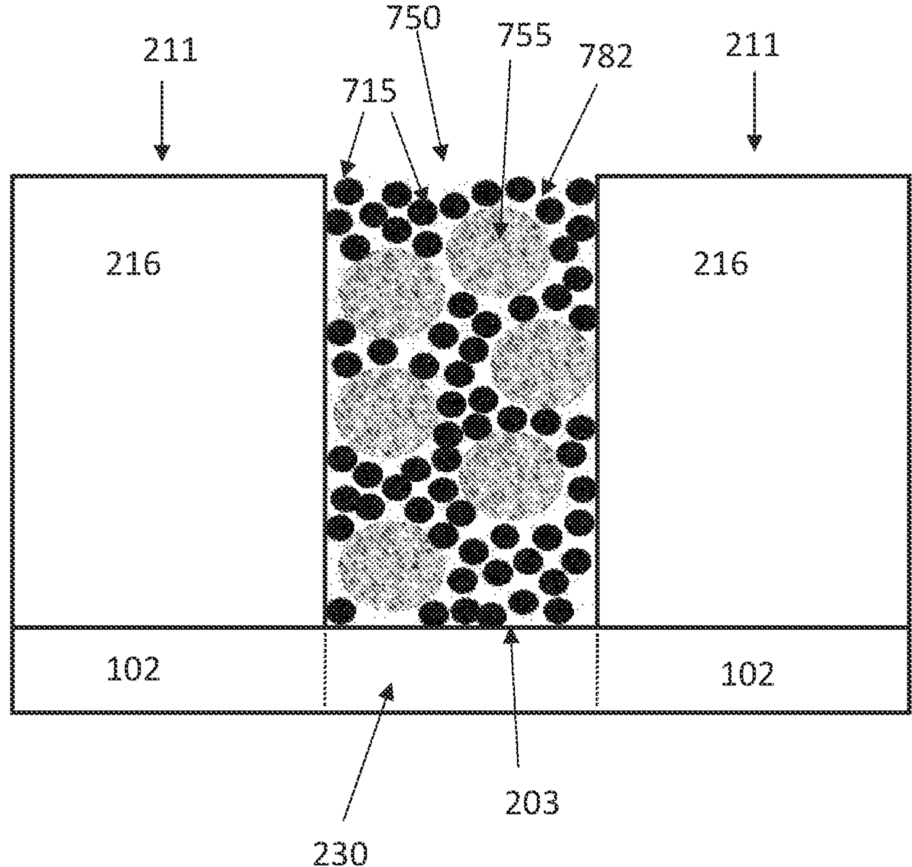

FIG. 7C illustrates such a scattering layer that reduces crack sensitivity while maintaining high scattering, and high optical separation of the pixels. In FIG. 7C, scattering layer 750 includes larger particles such as porous particles 755 in addition to the high refractive index scattering particles 715. Porous particles 755 and scattering particles 715 are disposed in a binder matrix 782. Scattering particles 715 may be, for example, titanium dioxide particles. The binder matrix 782 may be, for example, silicone. Porous particles 755 include cavities, or pores, within the particles, which cavities contain gas, such as air. The scattering of the layer is not significantly compromised by the presence of porous particles 755 because the internal porosity of these particle contributes to the scattering of the layer. This in contrast to larger particles that are non-porous, which, while also reducing crack sensitivity, would decrease the scattering of the scattering layer (which scattering layer is layer with a relatively narrow width W (see FIG. 7D), the constraint is that the scattering must be achieved in a thin layer with width W. The porous particles 755 are much larger than the scattering particles 715. The composition of scattering layer 750 may be, for example, 20-50 volume % scattering particles 715, 20-50 volume % porous particles 755, and 10-30 volume % binder matrix 782. For example, the composition may be 20-50 volume % $TiO_2$ particles, 20-50 volume % silica particles, and 10-30 volume % binder matrix. If more porous particles 755 are included in the scattering layer 750, the amount of scattering particles 715 needed to maintain a high scattering level may be reduced, which is due to special constraints. That is, volume within the scattering layer that is occupied by porous particles 755 cannot be occupied by scattering particles 715. The use of the larger particles 755 is to reduce the crack sensitivity of the scattering layer, and the porous particles introduce additional scattering which compensates for the loss of scattering that occurs by reducing the amount of scattering particles 715. That is, as the volume % porous particles is increased, the volume % of scattering particles may be decreased. More details of the porous particles 755 are described below with respect to FIG. 8.

Figure 7D:
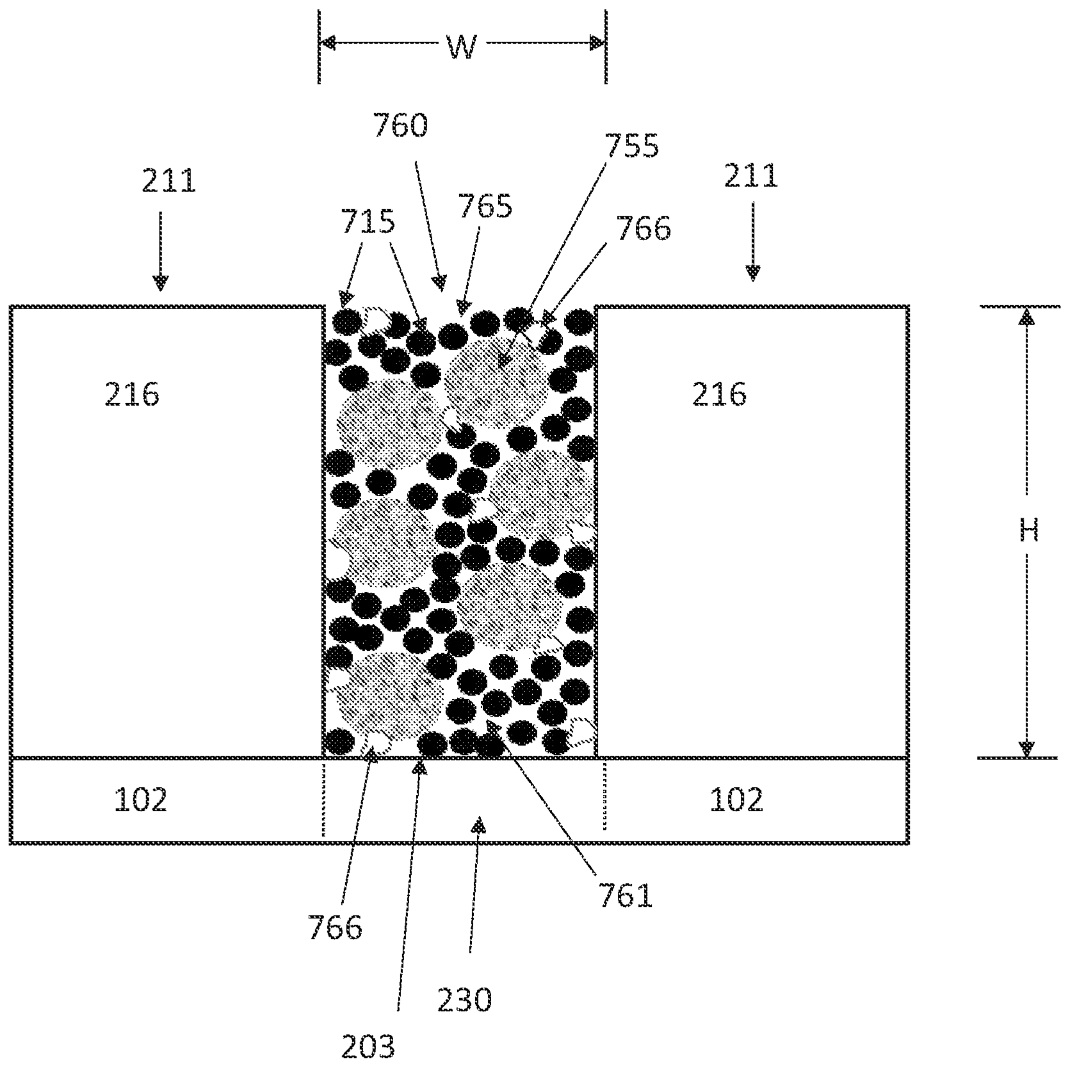

FIG. 7D illustrates another example of a scattering layer that maintains a high level of scattering, and thus a high optical separation of the pixels, while also reducing crack sensitivity in the array. In FIG. 7D, scattering layer 760 also includes porous particles 755 and scattering particles 715 disposed in a binder matrix 765 formed from a sol-gel. Similar to binder matrix 740 in FIG. 7B, binder matrix 765 may be formed using a sol-gel process, and thus may also result in sol-gel binder matrix material 761 and openings 766 forming the binder matrix 765. More details of such a sol-gel process are described below with respect to FIG. 9. The openings 766 containing a gas, such as air, are disposed in the interstices between the scattering particles 715 and porous particles 755. Similar to above with respect to FIG. 7B, while in general the drawings are not to scale, for purposes of illustration, the relative size of the openings 766 as shown FIG. 7D are significantly larger than they would be in the actual device. The porous particles 740 are relatively larger than the scattering particles 715. The composition of scattering layer 760 may be, for example, 20-30 volume % scattering particles 715, in the range of 50 volume % porous particles 755, 5-15 volume % binder matrix material 761, and the remaining 10-20 volume % openings 766 in the binder matrix containing gas. If the amount of gas (air) in the porous particles and amount of gas (air) in the openings 766 are added, the scattering layer 760 may have in the range of 40 volume % air. The scattering provided by the scattering particles 715 may be enhanced by the openings 766 containing gas, such as air, in the binder matrix in addition to the air contained within the porous particles 755, which improves the optical separation of the pixels 211 while reducing the sensitivity of the scattering layer to cracking.

Figure 8A:
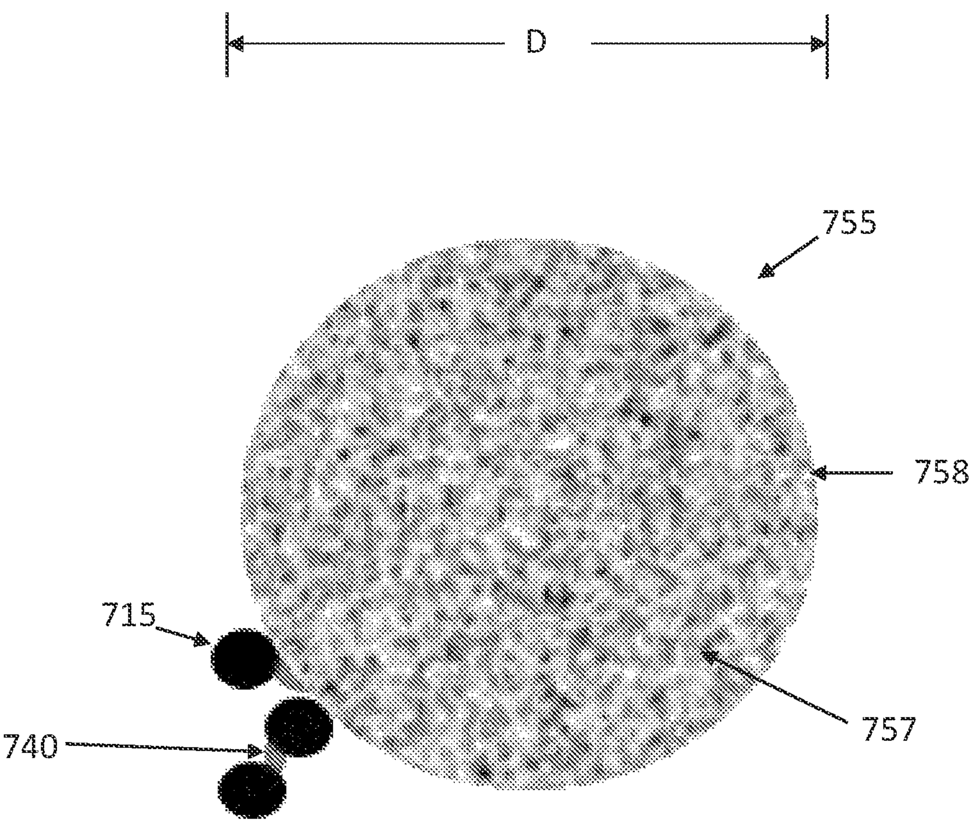
FIG. 8A illustrates an expanded view of an individual porous particle and also shows a portion of a sol-gel formulated binder matrix.

FIG. 8A illustrates an expanded view of an individual porous particle 755 and also shows a portion of the sol-gel formulated binder matrix material 761.

The porous particles 755 may include cavities 757 through and/or within the particles 755. Pores 757 may contain a gas, such as air, which air serves to increase the refractive index difference in the scattering layer 750, 760, improving scattering and enhancing the optical separation of lighting pixels 211.

Parameters that may be considered when choosing porous particles 755 for use in the scattering layer 750, 760 may include the shape of the porous particles, the maximum size and size distribution of the porous particles, and the volume of air or porosity of the porous particles.

With respect to the shape. The porous particles 755 may be spherical or relatively spherical. The inventors have found that spherical, or relatively spherical, porous particles 755 help reduce crack sensitivity and, while not wishing to be bound to any theory, believe that the higher packing density that can be achieved with spherical, or relatively spherical, porous particles 755 improves the reduction in crack sensitivity. Particles that have irregular shapes that are not spherical may, however, also be used.

With respect to size, as shown in FIG. 8A, the porous particles 755 may each have a diameter indicated as "D." In a group of porous particles, there will be a distribution of sizes. In that distribution, dmax is a largest size of D of particles in the distribution. D50 is the average size D of particles (50% of particles have a number average size D larger than D50 and 50% smaller than D50) in the distribution. D90 means that 90% of the particles in the distribution have a number average size D smaller than this size, and D10 means that 10% of the particles in the distribution have a number average size D smaller than this size.

The size of the porous particles 755 to be used in a scattering layer 750, 760 of a particular pcLED array may be determined in part by the width W (illustrated in FIG. 7D) of the gap 203 (and likewise the trench 230 in the pcLED array over which the gap 203 is disposed). In particular, the porous particles 755 may be large enough to fit within the width W of gap 203, but not so large as to prevent formation of the scattering layer including scattering particles 715 with the binder matrix 782, 765. For example, in some embodiments, the average maximum diameter of the particles, $d_{max}$ may be approximately ⅓ of the width W of the gap 203. Average maximum diameter ($d_{max}$) may be between 0.25 W and 0.9 W, between 0.25 W and 0.5 W, or may between 0.3 W and 0.6 W. In practice, the value D90 may be used when selecting larger particles for use in the scattering layer, as D90 may be a more available parameter. Thus, D90 may be less than 0.9 W, for example, between 0.25 W and 0.9 W, or between 0.25 W and 0.5 W, or may be approximately 0.3 W. For example, for gap 203 width W of 15 μm-20 μm, particles having a D90 of 5 μm may be used. In another example, for a gap 203 having a width W of 15 μm-20 μm, particles may be used with a D50 of between 3-4 μm and D90 of between 5-6 μm, for instance a D50 of 3.7 μm and D90 of 5.6 μm. In yet another example, for a gap 203 having a width W of 15 μm-20 μm, particles may be used with a D50 of between 5-6 μm and D90 of between 7-8 μm, for instance a D50 of 5.1 μm and D90 of 7.3 μm. The relation of D50 and D90/D10 relates to the size and shape of the distribution, as will be discussed in more detail below. The width of the gap 203 W may be determined based on the method used to form the converter layer phosphor pixel array and/or by viewing under a microscope. Particle size can also be determined by viewing in a microscope, and/or by laser diffraction methods, and also such size information may be provided in manufacturer's specification or by methods understood by persons of ordinary skill in the art.

Although the scattering layer is formed to provide scattering and optical isolation between phosphor pixels separated by a gap having a width W, which may be used to determine porous particle sizes, another method for determining porous particle sized to use in a scattering layer containing scattering particles and larger porous particles is by the relative sizes of the two types of particles. For instance, the porous particles 755 may in general be at least 5 times larger, for example, 10 times larger, i.e., in the range of 5 to 15 times larger, than the scattering particles 715.

Figure 8B:
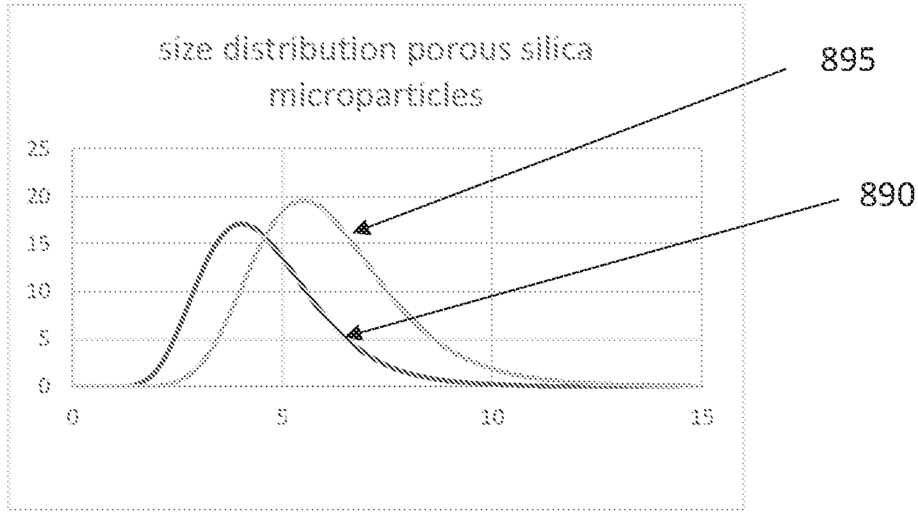
FIG. 8B illustrates particle size distributions for example porous particles.

FIG. 8B illustrates example size distributions for larger particles that may be used in scattering layers. With respect to the distribution of sizes of porous particles 755, the size distribution may affect the packing of the porous particles 755 within the scattering layer 750, 760. For instance, a narrower size distribution may result in more uniform packing of the particles 755. That is, while the maximum size dmax of the porous particles 755 needs to be less than the width W of the gap, if the distribution is broad, there may be few porous particles having the relatively large size to provide reduced cracking. FIG. 8B shows size distribution graph for two different example distributions of larger particles that may be used in a scattering layer, and in particular in a scattering layer with a W in a range of 15 μm-20 μm. In distribution 890, the D50 is 3.7 μm, D90 is 5.6 μm, and D10 is 2.4 μm, thus, a majority of the particles are between approximately 2 μm and 6 μm. In distribution 895, D50 is 5.1 μm, D90 is 7.3 μm, and D10 is 5 μm, thus a majority of the particles are between approximately 5 μm and 8 μm. For distribution 895, 99% of the particles are under 10 μm. For both distributions, dmax is less than 15 μm.

The cavities 757, within the porous particles 755 may be of any shape, and generally have an irregular shape. Cavities 757 may have average size along a widest portion of, for example, between 100 μm and 300 μm, and in some embodiments, approximately 200 μm. The cavity size distribution can be characterized using BET (Brunauer, Emmett and Teller) theory as understood by persons having ordinary skill in the art and referenced by various standards organizations. BET method may be used to evaluate the gas adsorption data and generate a specific surface area result expressed in units of area per mass of sample ($m^2/g$). So, for example, porous particles 755 may have an upper BET in the range of 25 $m^2/g$, a lower limit in the range of 5 $m^2/g$, and an average BET in the range of 15 $m^2/g$. In general, the more porous the particles 755, the more air there is within the particles, and thus the more scattering in the scattering layer. However, there is an upper limit. For instance, a hollow particle would not provide the scattering that is needed. In general, inventors have found that an upper limit of 50% cavity volume within a porous particle 755, and a cavity (or pore) size of 200-300 nm, which changes the refractive index every, approximately 200-300 nm, provides the desired scattering, i.e., provides minimal reduction of the scattering of the scatter layer having a fixed W in which the larger particles are incorporated to maintain mechanical properties of the scattering layer, in particular to avoid cracking. The cavities 757 may extend to the outer edge 758 of the particles 755, in which case some of the binder matrix material 782, 761 may enter the cavities 757 of the particle, particularly the ends of the cavities 757 open at the outer edge 758. However, during formation of the scattering layer 750, 760 in which the binder matrix is formed, if some of the binder matrix precursors enter the cavities 757 of the porous particles 755, after solvent evaporation and, for example for a sol-gel process, cross-linking of the precursors used to form the binder matrix, the volume of binder matrix material will be smaller. As a result, binder matrix material 782, 761 does not significantly fill pores 757, and pores 757 remain open enough that there is enough air to provide scattering. In a case in which the surface 758 of particles 755 is closed, no binder matrix material 782, 761 enters the pores 757. The large particles may be formed of any suitable material, in particular, the material used for the porous particles may have a high refractive index, itself, to further enhance scattering. The material used for porous particles 755 may be, for example, silica or titania.

In further respect to the porosity of porous particles 755, inventors have found that using larger particles that are not porous, but are solid and do not contain cavities 757, can be used to reduce crack sensitivity in the scattering layer. However, such non-porous, larger particles, while reducing crack sensitivity, also reduce the amount of scattering significantly, which reduces the amount of optical isolation. If the application requires reduction in crack sensitivity and loss of scattering is not a concern, non-porous particles may be used in place of the porous particles 755 shown in FIGS. 7C and 7D. Such non-porous particles for use in scattering layer 750, 760 may have a dmax and size distribution as noted above with respect to porous particles 755.

Figure 9A:
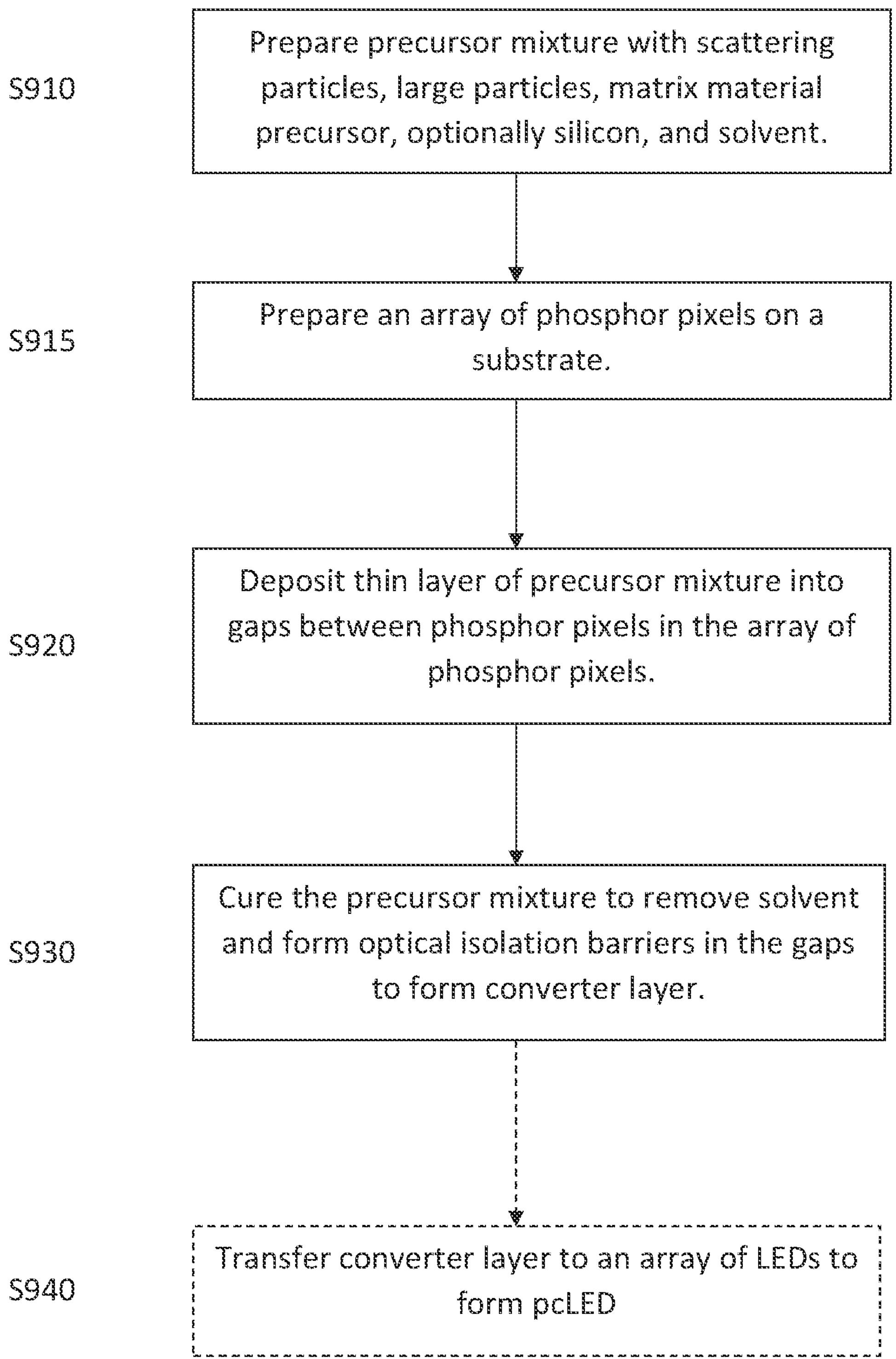
FIGS. 9A and 9B illustrates method of forming porous scattering layer.

FIG. 9A illustrates a method of forming scattering layers having porous particles, such as scattering layer 750, 760 of FIGS. 7C and 7D, respectively. In FIG. 9, at S910, a mixture, which may also be referred to as a coating liquid, is prepared that contains scattering particles, porous particles, binder matrix material precursor, solvent, and, optionally, silicone. Instead of porous particles, the mixture may alternatively include larger, non-porous particles, as noted above. Particles, may for instance, have a D50 at least 5 times larger than the D50 of the scattering particles. The scattering particles and porous, or large non-porous particles are as described above. The matrix material precursors and solvents that may be used will be described in more detail below. The amounts of scattering particles, porous particles, and binder matrix material precursor used in the mixture are in the proportions that are desired for the resulting scattering layer. The amount and proportions of scattering particles included in the mixture may be in the ranges as described above for the scattering layer. Silicone may optionally be added to the precursor mixture. Adding silicone may modify the mechanical properties of the scattering layer. The amount of silicone used may be lower than the amount of sol-gel. At S915 an array of phosphor pixels is prepared. The substrate on which the array of phosphor pixels is prepared may be, for example, a monolithic LED array such as shown in FIG. 2A, or may be, for example, a carrier tape or other substrate from which a finished converter layer may be transferred onto an LED array. The array of phosphor pixels may alternatively be an array of pcLEDs separately assembled using, for example, a pick and place tool, into an array such as that shown in FIG. 2B. The processes for manufacturing such phosphor arrays, including the use of photoresists and coatings, is known to persons having ordinary skill in the art.

At S920, a thin layer of the mixture can be deposited onto an array of phosphor pixels prepared in S915. The thin layer of mixture is deposited into open gaps between phosphor pixels, or, alternatively into open gaps between the phosphor pixels as well as open trenches between the LEDs, by any one of various coating technologies, such as, for example sedimentation, electrophoretic deposition, blade coating, etc. The thin layer of mixture is deposited on the surface of the LED array or carrier substrate so as to fill, or mostly fill, the gaps 703 (and trenches 230 if they are open between pcLEDs of the array), but not cover the LEDs of the array, so as not to affect light output from the LEDs of the array.

At S930, the thin layer of mixture deposited in the gaps 203 (and trenches 230 if they are open between LEDs) of the array of phosphor pixels is cured to remove the solvent and convert the binder matrix material precursor to form the binder matrix. Such curing may involve methods including, for example, heating, drying, adding a chemical agent, such as an acid, and/or any one of a number of other curing methods as are known to persons having ordinary skill in the art. The particular curing method used depends on the matrix precursor material used, as will be described in more detail below. Curing causes the matrix material precursor to form the matrix and removes the solvent, leaving the scattering particles and porous particles embedded in the cured matrix. If the binding matrix precursor material is a sol-gel precursor compound, as described in more detail below, as the mixture is cured, openings may form in the matrix material and within the interstices between the scattering particles and the porous particles, resulting in, depending on the choice and concentrations of binder matrix material and solvent, a scattering layer such as scattering layer 765 of FIG. 7D.

At S940, if the thin layer mixture has been deposited and cured on an array of phosphor pixels that is formed on a substrate for transfer to an array of LEDs, such as a carrier film or tape, the converter layer, a converter layer structure, such as a converter layer film or tile, is formed. The converter layer film or tile, which includes the array of phosphor pixels optically separated by the scattering layer formed in S910, S920 and S930, may be transferred to an array of LEDs, to form a pcLED array. Such a transfer may be accomplished using methods as are known to persons having ordinary skill in the art, such as by aligning the phosphor pixels with the LEDs, binding the film to the LED array, and removing the carrier substrate.

The matrix material precursor used may be any compound or mixture of compounds that are capable of forming the binder matrix, and that have an appropriate refractive index for the intended lighting application.

For example, matrix material precursor may be a silicone, such as a low index silicone as are known to persons having ordinary skill in the art, and/or may be precursors for a sol-gel process. For example, a dimethylsilicone with a refractive index of 1.41 may be used.

The solvent used with the matrix material precursor may be any solvent that when the mixture is cured, and the solvent is removed, leaves a binder matrix. If a scattering layer, such as scattering layer 765 of FIG. 7D, is to be formed, a solvent that leaves a binder matrix that includes openings may be used. Typical solvents used PGMEA (propylene glycol methyl ether acetate), toluene or cyclohexanone for high index silicones or heptane or hexamethyldisiloxane for low index silicones.

To form the scattering layer 760 shown in FIG. 7D having the scattering particles disposed in a sol-gel binder matrix material with openings the matrix material precursor may be a compound or compounds that can be used in a sol-gel chemistry method. In sol-gel chemistry, alkoxy groups are hydrolyzed and in the subsequent condensation between two hydrolyzed groups, for instance silanol groups, water is released and if one group is hydrolyzed and the other is not, an alcohol is released. The sol-gel composition preferably contains a number of temperature resistant non-hydrolysable organic groups, methyl groups, to reduce the final crosslink density, which leads to an increase in the maximum layer thickness of the material. As sol-gel is much stronger crosslinked than the silicones that are used for optical applications, this can lead to significant shrinkage during cross linking. In addition, sol-gel materials are always used in solvents, including the alcohols that are formed in the hydrolysis reaction, therefore a porous scattering layer will be formed using sol-gel. Such sol-gel matrix material precursor may be, for instance, silicon-based sol-gels, and therefore may have refractive indices $R_i$ in a range of 1.4 to 1.6. When the scatter layer 750, 760 is formed, the scattering particles and porous particles are held in the sol-gel binder matrix material, which is not continuous, but contains the openings as described above.

Sol-gel materials that may be used as the matrix material precursor include, for example, mixtures methyl-tri-ethoxy silane and dimethyl-diethoxy silane. The methyl-tri-ethoxy silane can form three siloxane bonds per silicone atom and the dimethyl-diethoxy silane can form only two siloxane bonds per silicon atom. A mixture of the two precursors can be formulated and cured by hydrolyzing with addition of an acid (acetic acid) and water. The mixture is chosen such that the layer is not prone to cracking after, for instance, a solder reflow process, while for a sol-gel precursor such as tetra-ethoxy silane, such cracks are frequently found upon (rapid) cooling down.

Figure 9B:
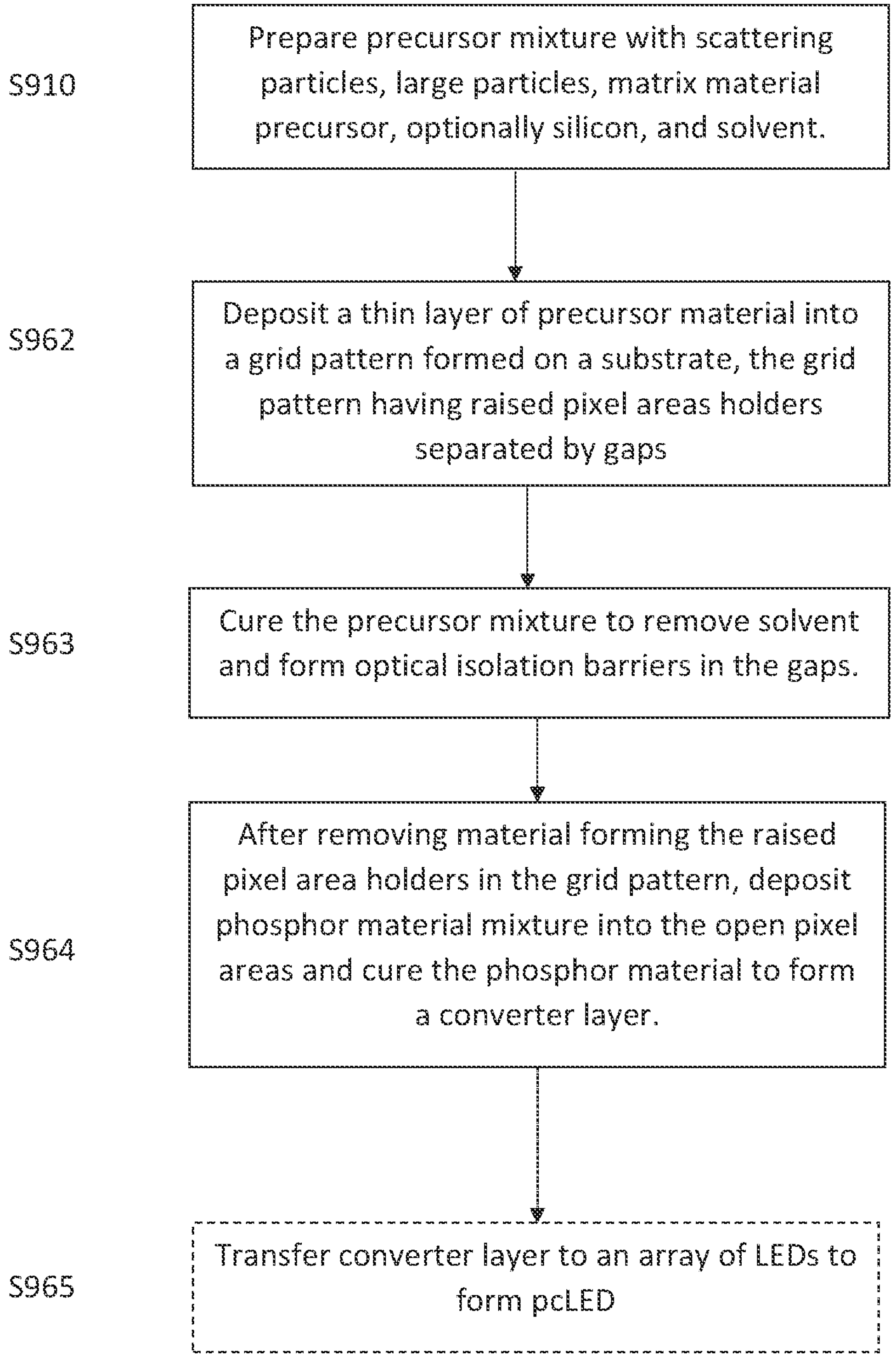

FIG. 9B illustrates another method of forming scattering layers having porous particles, such as scattering layer 750, 760 of FIGS. 7C and 7D, respectively. At S910, the precursor mixture is prepared as described above with respect to FIG. 9A. In the method shown in FIG. 9B, instead of forming a pixel array on a substrate, a grid pattern is formed in which raised pixel area placeholders are formed with gaps between them, which may be accomplished using, for example, photoresist methods or other methods, as are known to persons having ordinary skill in the art. As in FIG. 9A, the substrate may be a monolithic array of LEDs or may be a carrier substrate. At S962, the precursor mixture is deposited into the gaps of the grid pattern and cured. At S964, after removal of the material forming the raised pixel area holders, a phosphor precursor material is deposited in the pixel areas and cured, using methods known to persons having ordinary skill in the art to form a converter layer. Similar to FIG. 9A, if the converter layer was formed on a carrier substrate, at S965 it is transferred and bonded to an LED array.

Figure 10:
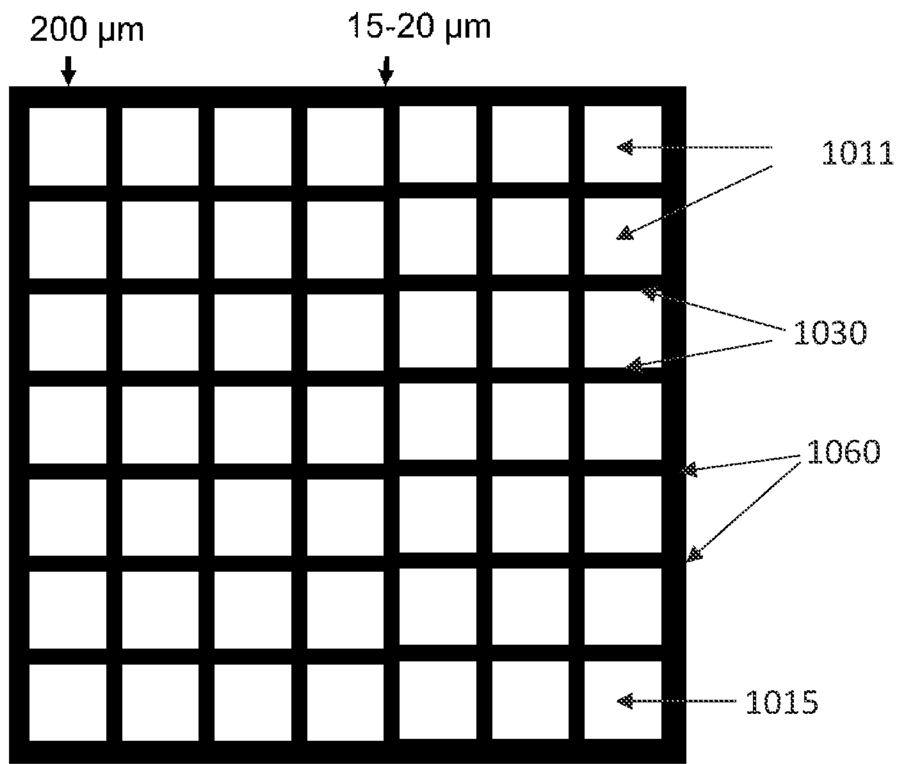
FIG. 10 illustrates an application of the scattering layer as disclosed herein in which significantly reducing cross-talk, or light leakage, between pixels is important.

FIG. 10 illustrates an application of the scattering layer as disclosed herein in which significantly reducing cross-talk, or light leakage, between pixels is important. FIG. 10 illustrates an example of an LED array that may be used in a camera flash unit to provide camera flash lighting, for example, in the camera flash system 500 described above with respect to FIG. 5. Cameras used in smart phones may incorporate such a camera flash unit. In particular, when the light provided from the camera flash unit is adaptive, and adjusts to the scene based on input provided by sensors and other instructions and profiles, reducing light leakage between pixels improves the quality of the flash lighting, and hence improves the quality of the resulting photograph.

In FIG. 10 illustrates a top view of converter layer having an array 1010 of 7×7 phosphor pixels 1011, each pixel having a light emitting surface area 1015 of 200 μm×200 μm. Gaps 1030 separating the pixels have a width W of 15-20 μm. Gaps 1030 are filled with scattering layer 1060.

To form scattering layer 1060, a sol-gel hydrolysis mixture was prepared using a mixture to methyl-tri-ethoxy silane (MTES) and dimethyl-di-ethoxysilane (DMDES) (both MTES and DMDES from Fisher (Thermo-Scientific Acros)). In this example, 1 g of MTES and 3.5 g of DMDES were mixed with 15 ul acetic acid (Fisher Scientific), followed by the addition of 2 ml water to start the hydrolysis. Separately a particle dispersion was prepared in which 1 g $TiO_2$ particles (R105 from Chemours-Dupont) having an average size of 100-300 nm and 0.5 g porous silica particles (Commercially available, Daisogel, Osaka Soda; Siliaspheres (Silicycle) could also be used) with internal pore size of effectively 200 nm and an outer diameter of about 5 μm were dispersed in 1 ml isopropanol (Fisher Scientific). After hydrolysis with acetic acid, 0.5 g of the sol-gel hydrolysis mixture was added to the particle dispersion and mixed to form the precursor mixture (a coating liquid). In this example, the coating liquid is deposited in a grid pattern formed of a photoresist structure, in which the photoresist remained within the phosphor pixel areas. Trenches between the photoresist formed gap areas into which the coating liquid was coated. The deposited coating liquid was cured by a heat treatment at 150° C. to form the scattering layer 1060. After curing the photoresist was removed and the open spaces were filled with a phosphor to form the converter layer. It was determined by examining the array 1010 through the glass substrate using microscopy, that the scattering layer penetrated well into the gaps 1030.

For comparison purposes, a similar array was prepared but with a comparison scattering layer that did not include the porous particles, i.e., a scattering layer similar to scattering layer 730 of FIG. 7B, in the trenches. To prepare the comparison scattering layer a sol-gel hydrolysis mixture was prepared using the same mixture of methyl-tri-ethoxy silane and dimethyl-di-ethoxysilane as above. Separately, a particle dispersion was prepared in which $TiO_2$ particles having an average size of 100-300 nm were dispersed in 1 ml isopropanol, but without the porous particles. The sol-gel hydrolysis mixture was added to the particle dispersion without the porous particles and mixed to form a coating liquid without porous particles. 2 μl of the coating liquid without coating particles was dosed onto a 7×7 array of LED pixels, which, similar to that described above, was situated on glass and in which the trenches had a depth H of 50 μm. The deposited coating liquid without porous particles was cured by a heat treatment at 150° C. to form the comparison scattering layer.

Both the 7×7 array with the scattering layer having porous particles and the 7×7 pixel array having the comparison scattering layer without porous particles were then subjected to another heat treatment up to 280° C. (similar to what would occur in a solder reflow cycle) and cooled. Both arrays were examined. Cracks were present in the comparison scattering layer without the porous particles both along the outside of the array and on top of the trenches. For the array having the scatting layer containing the porous particles, such cracks were not observed. Additionally, when the pore size of the porous particles is in the range of 200 nm (as determined using BET method described above), the porous particles contribute to scattering and the optical isolation of the scattering layer remains high. The reduction of the crack sensitivity, while maintaining high scattering, is achieved through use of porous particles. If non-porous larger particles are used, crack sensitivity can be reduced, but at the expanse of lowering the scattering of the scattering layer significantly, if porous particles, with diameters of cavities of around 200 nm are used, also the larger particles contribute to the scattering.

Although described with respect to optical separation of LEDs within an LED array, the scattering layer disclosed herein may be used in any optical device which requires a high degree of optical isolation and/or separation of light emitted from a light source. Such optical devices may include any pixelated LED or microLED. For microLEDs, the gaps between pixels may be narrow, allowing for only small porous spheres. If the distance between neighboring pixels is larger, optical isolation is usually sufficient with use of scattering particles. The use of larger, porous particles is especially useful for gaps having a W between 10 μm and 50 μm.

The invention claimed is:

1. A light emitting device comprising:

a plurality of light emitting diodes arranged in an array extending in a horizontal direction;

a plurality of phosphor pixels disposed over the light emitting diodes in a vertical direction perpendicular to the horizontal direction, and a scattering layer disposed in gaps between phosphor pixels, the scattering layer comprising:

a binder matrix, a plurality of scattering particles disposed in the binder matrix, and a plurality of larger particles disposed in the matrix, the larger particles being larger than the scattering particles.

2. The light emitting device of claim 1, wherein the gaps have a width W and the larger particles have a maximum particle diameter D90 that is less than 0.9 W.

3. The light emitting device of claim 2, wherein the larger particles are spherical.

4. The light emitting device of claim 1, wherein the larger particles are porous, and include cavities containing a gas.

5. The light emitting device of claim 4, wherein the gas is air.

6. The light emitting device of claim 4, wherein the larger particles comprise silica.

7. The light emitting device of claim 4, wherein the larger particles comprise cavities having an average size of between 100 nm and 300 nm.

8. The light emitting device of claim 1, wherein the binder matrix comprises a sol-gel material.

9. The light emitting device of claim 1, wherein the binder matrix further comprises openings disposed in the binder matrix, the openings containing a gas.

10. The light emitting device of claim 1, wherein the binder matrix comprises silicone.

11. The light emitting device of claim 1, wherein the scattering particles comprise between 20 to 50 volume percent of the scattering layer, the larger particles comprise between 20 to 50 volume percent of the scattering layer, the binder matrix comprises between 10 and 30 volume percent of the scattering layer.

12. The method of claim 1, wherein a majority of the larger particles are less than 10 microns in maximum diameter.

13. A method of forming a converter layer for a lighting device, the method comprising:

forming a plurality of phosphor pixels on a carrier substrate;

depositing a layer of a mixture into gaps between the phosphor pixels, the mixture comprising scattering particles, porous particles containing a gas, a binder matrix precursor material, and a solvent;

curing the layer to remove the solvent and convert the binder matrix precursor material into a binder matrix, the scattering particles and porous particles being disposed within the binder matrix to form a scattering layer in the gaps, and removing the substrate to form a converter layer structure.

14. The method of claim 13, wherein the binder matrix precursor material comprises sol-gel precursor compounds and the binder matrix comprises hydrolyzed sol-gel and openings.

15. The method of claim 13, wherein the sol-gel precursor compounds comprise a combination of methyl-tri-ethoxy silane and dimethyl-diethoxy silane and the solvent comprises an alcohol.

16. The method of claim 13, wherein the gaps have a width W and the porous particles have a D90 particle diameter that is less than 0.9 W.

* * * * *